United States Patent [19]

Shinohara et al.

[11] Patent Number: 5,177,670
[45] Date of Patent: Jan. 5, 1993

[54] CAPACITOR-CARRYING SEMICONDUCTOR MODULE

[75] Inventors: Hiroichi Shinohara, Hitachi; Hirokazu Inoue, Ibaraki; Yoichi Abe, Hitachi; Akira Kato, Mito; Hideo Suzuki, Katsuta; Kazuji Yamada, Hitachi; Masaaki Takahashi, Hitachi; Keiichirou Nakanishi, Kokubunji, all of Japan

[73] Assignee: Hitachi, Ltd., Tokyo, Japan

[21] Appl. No.: 832,332

[22] Filed: Feb. 7, 1992

[30] Foreign Application Priority Data

Feb. 8, 1991 [JP] Japan .................. 3-017451

[51] Int. Cl.⁵ .................. H05K 7/20; H05K 1/16; H01L 23/02; H01L 39/02
[52] U.S. Cl. .................. 361/388; 257/697; 257/700; 257/924; 174/253
[58] Field of Search .............. 361/306, 320, 321, 400, 361/401, 388, 402, 395; 357/51, 65, 68, 80, 74; 174/68.5, 52 FP

[56] References Cited

U.S. PATENT DOCUMENTS

| | | | |
|---|---|---|---|
| 4,328,530 | 5/1982 | Bajorek et al. | 361/308 |
| 4,349,862 | 9/1982 | Bajorek et al. | 361/401 |
| 4,494,172 | 1/1985 | Leary et al. | 361/400 |
| 4,567,542 | 1/1986 | Shimada et al. | 361/321 |
| 4,622,058 | 11/1986 | Leary-Renick et al. | 65/105 |
| 4,800,459 | 1/1989 | Takagi et al. | 361/321 |
| 4,860,165 | 8/1989 | Cassinelli | 361/388 |
| 4,870,539 | 9/1989 | Chance et al. | 361/321 |
| 4,945,399 | 7/1990 | Brown et al. | 357/74 |
| 4,954,877 | 9/1990 | Nakanishi et al. | 357/80 |
| 4,999,520 | 3/1991 | Usami et al. | 307/456 |
| 5,027,253 | 6/1991 | Lauffer et al. | 361/321 |

FOREIGN PATENT DOCUMENTS

| | | |
|---|---|---|
| 57-37818 | 2/1982 | Japan . |
| 59-5654 | 4/1984 | Japan . |
| 61-6846 | 5/1986 | Japan . |
| 61-47691 | 8/1986 | Japan . |
| 62-169461 | 7/1987 | Japan . |
| 2-177350 | 9/1990 | Japan . |

OTHER PUBLICATIONS

Technical Research Report, vol. 88, No. 233, Oct. 21, 1988, pp. 19-24, Electronic Information Communicating Society.

Primary Examiner—Donald A. Griffin
Attorney, Agent, or Firm—Antonelli, Terry, Stout & Kraus

[57] ABSTRACT

Noise generated at high frequencies at the time of simultaneous switchings of logical circuits is reduced by lowering an inductance from LSI to a capacitor formed on a substrate. The capacitor is formed to ensure that an inductance from a bonding pad for the LSI loaded on the substrate to an electrode of the capacitor is 0.05 nanohenry. The lower inductance from the LSI to the capacitor allows a reduction in the amount of the noise at high frequencies among those generated in power supply system, whereby the rising time of signals is made shorter, and the speed of arithmetic operation can be increased.

8 Claims, 13 Drawing Sheets

FIG. IIA
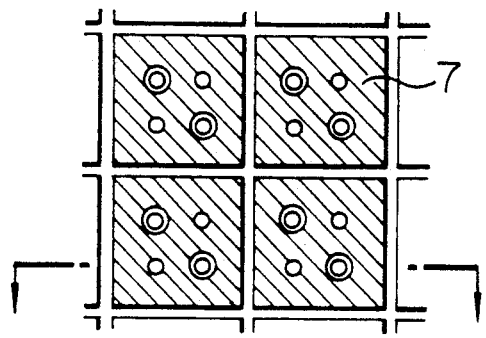
FIG. IIB
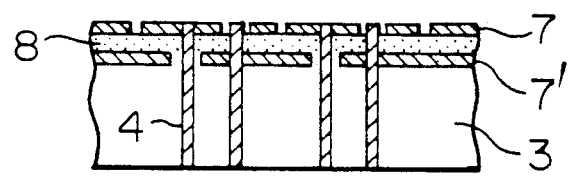
FIG. 12
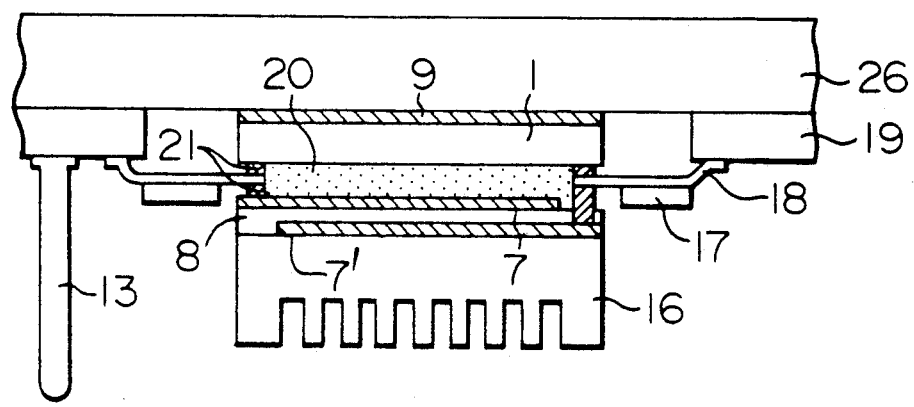

COOLING AIR

CAPACITOR-CARRYING SEMICONDUCTOR MODULE

BACKGROUND OF THE INVENTION

The present invention relates to a capacitor-carrying semiconductor module for use in computers for reducing noise generated at the time of simultaneous switching operations at frequencies on the order of a GHz.

Recently, advances in technology have made it possible for the arithmetic operations of electronic computers to be speeded up more and more. However, this increase in speed has been accompanied by significant problems involving erroneous behavior of these computers caused by the generation of noise resulting primarily from variation in voltage of the power supply of the computer due to switching and crosstalk, i.e., interactions between signal transmission lines.

Various techniques have been proposed for reducing the noise from the power supply, and one of the most effective techniques is to insert a capacitor in a circuit with the power supply.

Capacitors are generally characterized by their capacitance, breakdown strength and frequency dependence, though the breakdown strength property is not very serious because electronic computers work at low voltages. In addition, it will be expected that the breakdown strength property of these capacitors will be less important in the future because of a tendency for the working voltages to be lowered. On the other hand, the speed of the arithmetic operations of the electronic computers is being increased continuously with the result that the working frequencies will inevitably enter into a high frequency range of the order of a GHz in the near future. For this reason, a capacitor having excellent properties at high-frequencies is required, and this objective is expected to be increasingly more critical in the future. Therefore, it is believed that much interest will be directed to frequency characteristic of capacitors, rather than the breakdown strength thereof in the future.

It is well known that the capacitance of a capacitor depends greatly on the dielectric constant of the dielectric material disposed between the electrodes. It is also well known that the dielectric constant is definitely related to polarization and that the configuration of the polarization affects the range of the working frequency to a great extent. The polarization is determined by a combination of the following four types of sub-polarizations, i.e., (1) space-charge polarization, (2) orientation (bipolar) polarization, (3) ionic polarization, and (4) electronic polarization.

High permittivity materials such as $Pb(Mg_{1/3}Nb_{2/3})O_3$-$PbTiO_3$ (specific dielectric constant: on the order of $2 \times 10^4$) and barium titanate ($BaTiO_3$) (specific dielectric constant: on the order of $1 \times 10^4$) have a high dielectric constant produced by the orientation (bipolar) polarization.

Among the sub-polarizations, the ionic polarization and the electronic polarization can stably function even at high frequencies in the range of a GHz or more. Therefore, the dielectric materials for capacitors to be used at high frequencies in the range of a GHz or more should be preferably those capable of being polarized by ionic polarization and electronic polarization, such as $Ta_2O_5$. Recently, as reported in the article by Kan Yoshino, "High speed operation of packageable thin film $Ta_2O_5$ capacitor", Technical Research Report, Vol. 88, No. 233, Electronic Information Communicating Society, a unitary capacitor in a form which is attachable onto a ceramic substrate has been proposed. However, it comprises a material having a low specific dielectric constant (20 to 30) and a large film thickness such as 100 μm or more, so that its capacitance is at most 1 nF (nanofarad) (in dimensions of 2 mm square), which is short of the capacitance required for satisfactory absorption of noise. Moreover, no other circuit can be formed in the section comprising the capacitor, so that the packing density can not be increased.

Techniques for producing capacitors on a ceramic board have generally used technical applications requiring no high frequency characteristic. For example, there has been produced a composite ceramic board having capacitor elements and conductor lines formed integrally therein and sealed with insulating ceramics, as disclosed in Japanese Patents KOKAI (Laid-open) Nos. 62-169461 and 61-47691.

Also a chip carrier in which an array comprising a plurality of small capacitor elements disposed between at least one pair of ceramic sheets within sheets superimposed in a laminate has been proposed for the purpose of reducing noise generated at the time of simultaneous switchings, as disclosed in Japanese Patent KOKAI (Laid-open) No. 57-37818.

More recently, with the speeding up of the rising and descending times of signals used in logical circuits of electronic computers of a large type or a middle or small type, such as workstations, an increase in the number of the logical circuits to be simultaneously switched has produced a problem of generation of noise owing to such simultaneous switchings.

The present invention is directed to a reduction of noise generated in the power supply systems among others, though there are two sorts of noises attributable to power supply systems and signal circuits.

There are computers employing a combination of an ELC circuit, a bipolar bearing circuit and a CMOS circuit, forming a so-called BiCMOS circuit. When a plurality of logical circuits are simultaneously switched, noise is generated for various reasons via the power supplies. Among the noise which is generated, the most problematic cause for an ELC circuit may be attributed to fluctuation of the power supply Vtt, which fluctuation occurs owing to signal currents flowing into the power supply Vtt after passing through the terminal resistors. The noise which is generated due to this fluctuation of Vtt will be referred to herein as a "terminal resistor-simultaneous switching noise".

On the other hand, problematic noise in a BiCMOS circuit are the result of instantaneously flowing through-currents and inductances of the power supply lines. The reason for the generation of the through-currents in a BiCMOS circuit is that when a pair of transistors connected to the potential of the power supply and the earth potential in the BiCMOS circuit are switched corresponding to a logical "1" and "0" level, both transistors may be instantaneously in the ON state because one is switched to the ON state before the other finishes turning to the OFF state, resulting in the generation of a through-current. The rate of this transistor switching is of the order of 1 nanosecond or less, so that noise in the range of about 0.5 to 1 GHz is generated in the power supply under the influence of the inductance of the power supply system.

As a result of an intensive research on the problem of terminal resistor-simultaneous switching noises, it has been found that these noises contain a component $V_1$ having almost the same rising time as that of the signals used in arithmetic operations and a delayed component $V_2$ as shown in FIG. 4. A reduction in the noise component $V_2$ can be effectively achieved by providing a capacitor having a relatively large capacitance.

It has been found, however, that the fast rising noise component $V_1$ (rising time: 500 picoseconds or less) can not be reduced even with a capacitor of a higher capacitance. For this fast rising component $V_1$, the shorter the rising time of signals used in the arithmetic operations, the larger will be the amount of noise generated. In recent years, as the rising time has been shortened to 500 picoseconds or less, it has been found that the fast rising noise component $V_1$ produces serious problems.

Big noises beyond a certain limitation are undistinguishable from signal voltages, which makes it impossible to discern the logic "1" level from the logic "0" level. Therefore, the noises must be reduced below a certain level. In ECL circuits popularly used for high speed arithmetic operations in large type electronic computers, the logic signal amplitude is only of the order of 0.8 Volt, so that the amount of noise must be 100 mV or less. Even in a BiCMOS circuit, when the BiCMOS circuit is present in conjunction with an ECL circuit, the noise generated by the power supply system must be 100 mV or less in order to prevent the ECL circuit as well as the BiCMOS circuit itself from working erroneously owing to the noise generated by the power supply system in the BiCMOS circuit.

SUMMARY OF THE INVENTION

It is an object of the present invention to provide a package structure which is capable of reducing noise which may be otherwise generated by the power supply system, and more particularly, to provide a package structure which is capable of reducing noise at high frequencies having a rising or descending time of the order of 1 nanosecond or less.

BRIEF DESCRIPTION OF THE DRAWINGS

FIG. 11 is a diagrammatical view of separated capacitors formed on a module board;

FIG. 12 is a diagrammatical view of the structure of a capacitor formed for TAB connection;

DETAILED DESCRIPTION OF PREFERRED EMBODIMENTS

Figure 1:
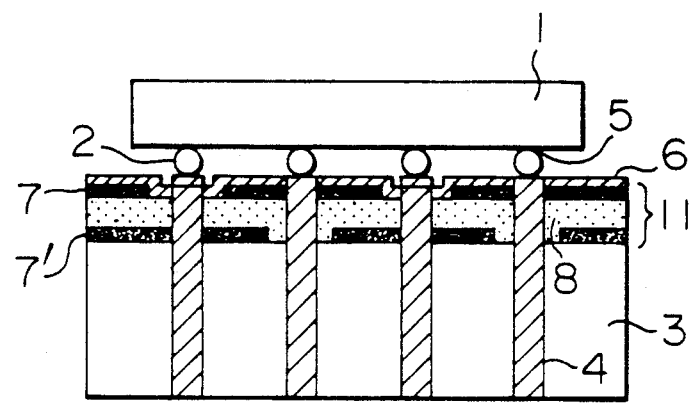
FIG. 1 is a cross-sectional view of a thin film capacitor formed on a carrier substrate.

In order to achieve the objects as described above, provision of capacitors is effective, and dielectric materials for the capacitors should exhibit less reduction in specific dielectric constant even at high frequencies in the range of 1 GHz or more. Components of the noise that is generated include those having a frequency in the range from a lower level of the order of 100 MHz to a higher level of the order of 1 GHz or more. An actual capacitor connected in parallel with a power supply in a circuit may be regarded as a series circuit having a capacitance, an inductance and a resistance connected in series. In this case, reducing noise requires a reduction in the impedance connected in parallel with the power supply. The impedance of a capacitor is inversely proportional to frequency and its capacitance, and the impedance of an inductor is proportional to frequency and its inductance. In order to reduce noise, therefore, the capacitance must be increased at relatively low frequencies, and it is important to lower the inductance to a certain level or below at higher frequencies of a GHz or more. Effective reduction in the amount of noise at lower frequencies of the order of 100 MHz requires a capacitance of 0.1 $\mu$F or more. It has been also found that a reduction in the amount of noise at higher frequencies of 1 GHz or more requires a reduction in the inductance from a bonding pad to a capacitor to at least 0.05 nanohenry or less. At higher frequencies of 1 GHz or more, the impedance of a capacitor, even having a lower capacitance, is small due to the higher frequencies, and a capacitance of at least 5 nF or more is effective to diminish noise. The positions of capacitors to be provided must be outside the LSI because the area in a LSI where capacitors can be formed is limited and capacitors having a higher capacitance are difficult to form therein.

With respect to inductances, interest has been directed heretofore to parts through which a flow of electric current can pass, such as through-holes and soldering connections. As a result of various and detail studies, however, it has been found that the inductance posessed by a capacitor itself must be taken into consideration. Studies on the inductance of a capacitor itself has lead to findings that the inductances posessed by the generally used chip capacitors are of the order of 0.2 to 0.8 nanohenry. And, a most simple arrangement of a capacitor (a cylindrical dielectric material having a thickness of about 1 mm and a diameter of about 1 mm) has an inductance of about 0.2 nanohenry. This is because the capacitor has an inductance owing to a magnetic field around the dielectric material generated by a displacement current flowing through the dielectric material part in addition to a current flowing through the electrodes. That is, the inductance is a physical quantity interconnecting an electric current and a magnetic flux, so that a capacitor itself has an inductance even in the absence of any connection of a wire lead to the capacitor. Although this inductance has not been taken into consideration because it is relatively small, it can not be neglected at higher frequencies of the order of a GHz.

In an ECL circuit, a capacitor must be connected between the power supply Vtt and the power supply Vcc to reduce the terminal resistor-simultaneous switching noise. It has been found as a result of analysis that the inductance from a bonding pad to the electrode of a capacitor must be not higher than 0.5 nanohenry in order to reduce the fast rising noise component $V_1$ of the components included in the terminal resistor-simultaneous switching noise to 100 mV or less, as seen in FIGURES. A higher inductance than the above range makes it difficult to reduce the noise component $V_1$ to 100 mV or less. With respect to the connection of the capacitor and the power supply, the through-holes corresponding to the power supply Vtt are all connected to one of the electrodes of the capacitor, while those corresponding to the power supply Vcc are all connected to the opposite electrode.

The value of an inductance from the power supply Vtt is that of an equivalent inductance from the Vtt of an LSI to the capacitor with the LSI short-circuiting all of a plurality of bonding pads of the Vtt. More particularly, an LSI has a plurality of power supplies having different potentials. For the purpose of reducing the inductance associated with each power supply, those power supplies having an identical potential in the LSI are unified to supply power when the power is transmitted through a plurality of bonding pads to the LSI. In this case, the value of the inductance from the bonding pads of the power supply Vtt of the LSI to the capacitor, i.e., that from one of the bonding pads to an electrode of the capacitor, may be of the order of 1 nanohenry or less, a plurality of which should be connected in parallel to allow the equivalent circuit to have an inductance not higher than 0.05 nanohenry. The value of the inductance will refer to an equivalent inductance value when the same type power supplies are connected in parallel, unless otherwise indicated, hereunder.

Figure 6:
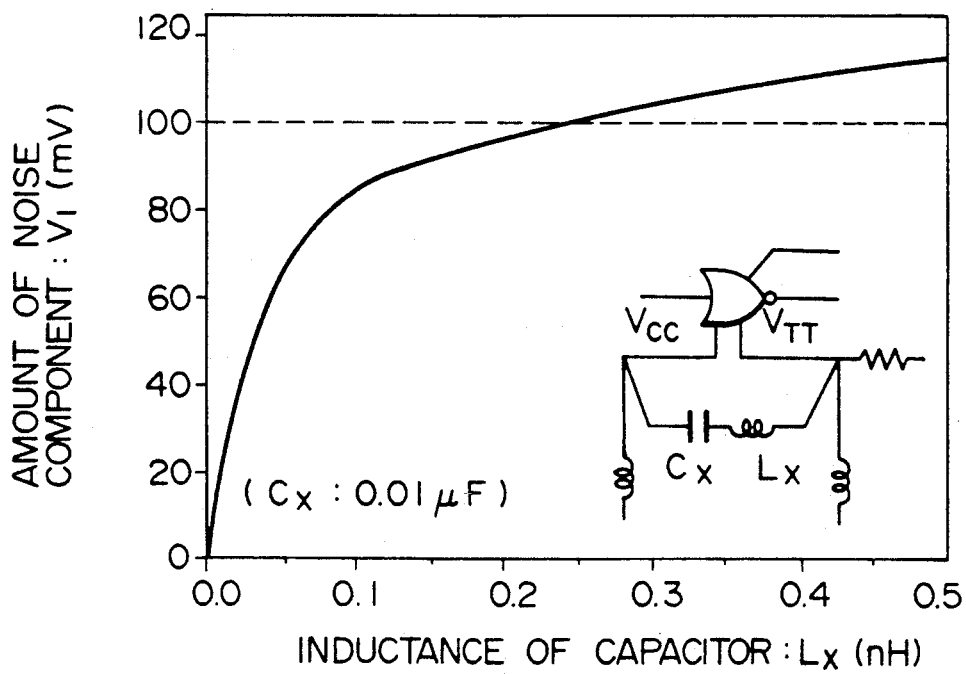
FIG. 6 is a graphical illustration showing a relationship between the inductance of a capacitor itself and the amount of the noise component $V_1$.
Figure 8:
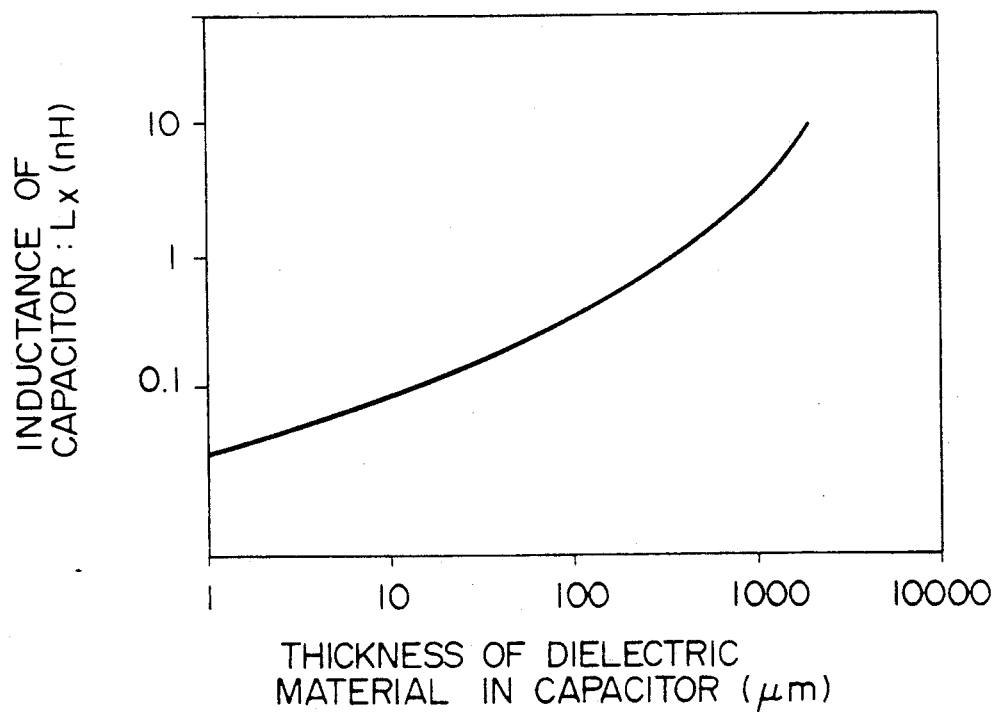
FIG. 8 is a graphical illustration showing a relationship between the thickness of a dielectric material in a capacitor and the inductance of the capacitor itself.

In order to diminish the noise component $V_1$ of the terminal resistor-simultaneous switching noise to 100 mV or less, it is required that the inductance of the capacitor itself be not higher than 0.2 nanohenry. This is because the amount of noise can not be lowered to 100 mV or less even with the capacitor being connected as close to the LSI as possible, if the inductance of the capacitor itself is higher than 0.2 nanohenry, as seen in FIG. 6. As to the inductance of the capacitor itself, it has been found as a result of studies that the inductance is lowered as the thickness of the dielectric material layer in the capacitor is reduced. It has been also found that the smaller the pitch of through-holes to be connected to the capacitor, the lower will be the inductance. The capacitor is connected between power supplies which are different in potential from each other. In the structure as shown in FIG. 1 where one of the through-holes 4 in the ceramic substrate 3 for the power supply Vcc is connected to one electrode 7 of each capacitor 11 and one of the through-holes 4 for the power supply Vtt is connected to the other electrode 7' of the capacitor 11 with the through-holes 7 and 7' penetrating the dielectric material 8, it has been found that for rendering the inductance of the capacitor itself 0.2 nanohenry or less, the thickness of the dielectric material 8 must be 50 μm or less when the through-hole pitch is 500 μm. FIG. 8 shows a relationship between the thickness of a dielectric material and the inductance thereof in the structure as shown in FIG. 1. In order to further lower the inductance preferably to 0.05 nanohenry or less, the capacitors should be made in the form of a thin film capacitor with a dielectric material having a thickness of 5 μm or less.

The method of connecting the LSI 1 and the substrate 3 on which the capacitors 11 are formed should employ flip chip bondings 2. This is effective to reduce fast rising noises because an inductance of the flip chip bonding is approximately as low as 0.02 nanohenry.

For making the inductance from the bonding pad 5 of the LSI 1 to the capacitor 0.05 nanohenry or less, the distance between the bonding pad 5 and the capacitor 11 on a substrate 3 should be preferably not greater than 100 μm.

Figure 9:
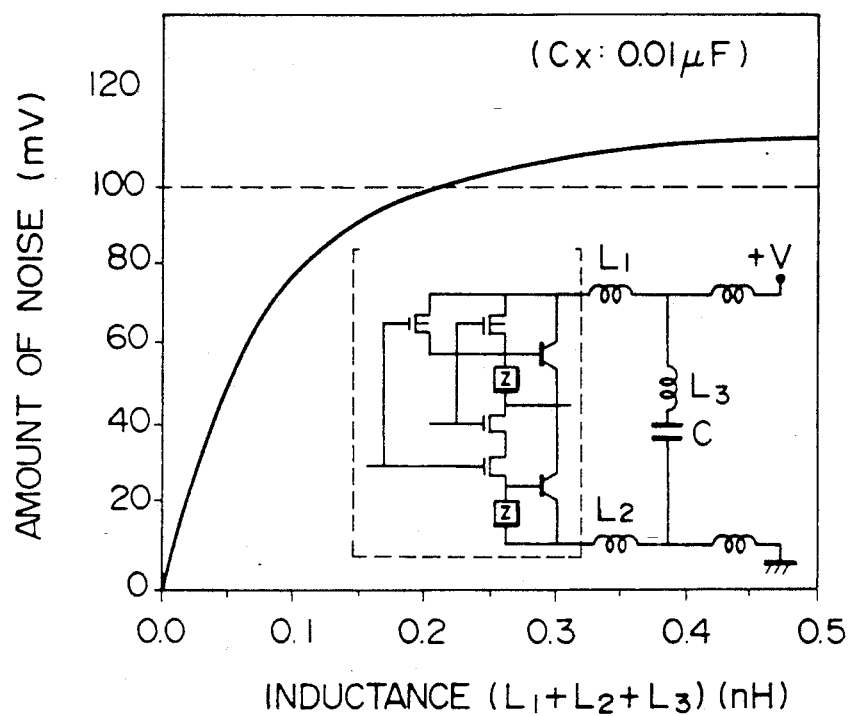
FIG. 9 is a graphical illustration showing a relationship between the inductance and the amount of noise in a BiCMOS circuit.

For the LSI of a BiCMOS circuit, a capacitor must be connected between the power supply potential and the earth potential to reduce noise generated under the influence of through-currents and the inductance of the power supply system. FIG. 9 shows a relationship between the inductance and the amount of noise in the BiCMOS circuit obtained by the analysis. An amount of noise which is not higher than 100 mV can be achieved by ensuring that the sum of the inductances $(L_1+L_2+L_3)$ is 0.2 nanohenry or less, where $L_1$ is an inductance from a bonding pad 5 at the power supply potential of the LSI to a capacitor, $L_2$ is an inductance from a bonding pad 5 at the earth potential to the capacitor and $L_3$ is an inductance of the capacitor itself.

Figure 7:
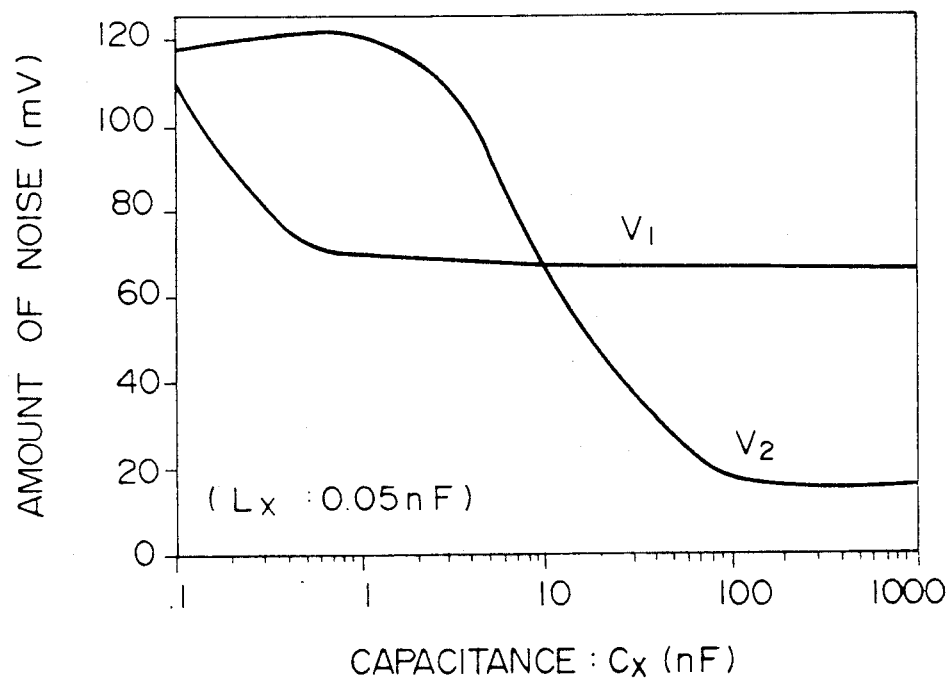
FIG. 7 is a graphical illustration showing a relationship between the capacitance and the amount of noise.

FIG. 7 shows a relationship between the amounts of noises $V_1$ and $V_2$ and the capacitance of a capacitor in the ELC circuit. As can be seen from FIG. 7, the capacitance of the capacitor must be at least 5 nF or more to ensure that noise having a rising or descending time of 1 nanosecond or less, to which the present invention is directed, is not higher than 100 mV. In order to reduce the amount of noise $V_2$ to 100 mV or less, it should be 10 nF or more.

The dielectric loss, tanδ should be 1% or less at 0.5 to 1.5 GHz, if possible, because when capacitors are used for the reduction of noise in a BiCMOS circuit, the energy accumulated in the capacitors having a greater dielectric loss thanδ is partly consumed as a loss on the side of the capacitors, in addition to being consumed for through-currents flowing in the BiCMOS circuit to prevent effective working thereof.

Assuming that an equivalent circuit of the capacitors consists of a circuit having a resistance, inductance and capacitance connected in series, the impedance of the capacitance is small at high frequencies and a relative voltage applied to the resistor becomes higher with an increase in apparent resistance due to skin effect. Taking account of such phenomenon, in order to allow the capacitors to work effectively at high frequencies, the electrode materials should be preferably those having an electric resistivity as low as possible, such as Al, Cu, Au, and Ag.

Materials to be used as dielectric materials for capacitors may be either organic or inorganic.

The effects of capacitors will now be discussed from the electrical point of view. The cause of the generation of the terminal resistor-simultaneous switching noises may be considered as follows. The waveform of a signal current flowing through the terminal resistors can be divided into various wave components by Fourier series transformation. Considering a relationship between a noise waveform and the wave components thereof, it may be concluded that the noises are made up of those wave components in the signal waveform which have such a magnitude of current multiplied by the magnitude of the impedance between the power supplies Vtt and Vcc to produce a large value. When the impedance on the side of capacitors viewed from the bonding pads for Vtt and Vcc in an LSI is very small at the frequencies at which noise is generated, the amount of noise to be generated between the Vtt and the Vcc will be small.

Lower impedances are considered to correspond to a case of lower inductances, or a case where an inductance and an capacitance causes a resonance. Such resonances include those caused by the effect of a distributed parameter circuit. That is, they include the phenomenon that at high frequencies of the order of a GHz, capacitors having parallel flat sheets may be regarded as a sort of transmitting line, and cause a resonance under the influence of waves reflected at the ends of the capacitors resulting in the lower impedances between the Vtt and the Vcc. The reduction in the amount of noise to 100 mV or less can be achieved by ensuring that the impedance on the side of the capacitors viewed from the bonding pads for Vtt and Vcc of in an LSI is not higher than 2 $\Omega$ at the frequencies at which noise is generated. As the frequencies of major noise components generated are in the range of 0.5 to 1.5 GHz, the impedances are required to be 2 $\Omega$ or less in the range of 0.5 to 1.5 GHz.

The effects of capacitors on the generation of noise due to through-currents in a BiCMOS circuit may be considered as follows. When the impedance on the side of the capacitors viewed from the bonding pads for the power supply potential and the earth potential in an LSI is indicated by Z(f) and a differential of the through-current flowing in the BiCMOS circuit by $\Delta I$, then the noise voltage $\Delta V$ generated between the power supply potential and the earth potential of the LSI is represented by the equation $\Delta V = -Z(f)\Delta I$. When Z(f) is small, the noise is small. In order to reduce the amount of the noise to 100 mV or less, the impedance Z(f) must be not higher than 2 $\Omega$ at the frequency generating the noise. As the frequencies of major noise components generated are in the range of 0.5 to 1.5 GHz, the impedances are required to be 2 $\Omega$ or less in the range of 0.5 to 1.5 GHz.

The 2 $\Omega$ impedance level is the value of an equivalent circuit under the conditions of electrically short-circuiting the bonding pads at the same potential. That is, the LSI is composed of several logical circuits, each of which has bonding pads for a power supply A and those for a power supply B connected to the circuit, so that the impedance on the side of the capacitors viewed from a set of the bonding pads for the power supplies A and B should be not higher than about 10 $\Omega$ and the equivalent value under the conditions of connecting a plurality of such sets in parallel should not be higher than 2 $\Omega$.

The impedance characteristic due to the effect of a distributed parameter circuit is determined by the properties of dielectric materials, such as specific dielectric constant and magnetic permeability, and the dimensions of the capacitor. As shown in FIG. 11, therefore, a capacitor formed on a substrate may be divided into appropriate smaller sizes to lower the impedances at frequencies of major noise components, whereby the noise can be reduced. Alternatively, the bottom electrode of one capacitor is connected to the earth potential while the top electrode is divided into several portions which are connected to different potentials, thereby allowing the capacitor comprising one dielectric layer to be connected to a plurality of different potentials. Thus, the best design permits effective utilization of capacitors formed with one dielectric layer and enhancement in the overall performance. Moreover, in the case of the capacitor divided into smaller capacitors, when some of the small ones fail as a result of pinholes and the like, simply by cutting off the failed ones with a laser and the like can achieve an increase in yield without significantly reducing the overall performance.

The capacitors connected to power supplies of the LSI may be regarded as a series circuit of capacitance, inductance and resistance at high frequencies. For the fast rising noise components, i.e., the noises at high frequencies of the order of a GHz, the capacitance may be regarded as being shorted, so that when the resistance is negligible, the effect of reducing the noises can be approximately determined only by an inductance component. Therefore, the reduction in the inductance from the LSI to the capacitor can lower the impedance at high frequencies and diminish the fast rising and descending noise component.

Layers absorbing surface roughness of a substrate on which capacitors are formed are not essential, but one of the reasons for using such layers is to overcome a difficulty in obtaining compatibility of the thickness of the dielectric film for high frequencies (5 $\mu$m or less) with the surface roughness of ceramics after firing (several tens of micrometer). Other attempts to overcome the difficulty include grinding the surface, and coating the surface with a glass layer or a resin layer.

The transmission rate of signals is greatly influenced by the dielectric constant of a dielectric material surrounding the signal transmission lines, and desirably the dielectric constant should be lower. Particularly, dielectric materials having a lower dielectric constant are indispensable for circuits working at high frequencies, such as at frequencies to which the present invention is directed. The use of materials having a lower dielectric constant (for example, mullite, glass ceramics and the like) for ceramic substrates enables the compatibility of two requirements counteracting each other, one of which is to surround the transmission lines with dielectric materials having a lower dielectric constant and the other of which is to have capacitors, which retain a large capacitance even at higher frequencies in the power supply circuit.

The currents flowing from through-holes into the capacitors at high frequencies of a GHz or more do not spread throughout the electrodes of the capacitors, but flow substantially through only limited areas around the through-holes. Thus, at high frequencies, an identical effect as that at the surface area of the electrode occurs resulting in an reduction in actual capacitance. Therefore, a plurality of through-holes may be provided in one capacitor to make the through-hole pitch small, whereby the capacitor can be made workable even at high frequencies.

EXAMPLES

The present invention is practically illustrated with reference to the following Examples, but without being limited thereto.

EXAMPLE 1

In order to fabricate a capacitor-containing a ceramic board, first a ceramic substrate was produced. For this purpose, a green sheet was produced as follows. As a ceramic batch, there was prepared a powdery mixture consisting of, in total of 100% by weight, 70 to 80% by weight particulate mullite ($3Al_2O_3.2SiO_2$) having an average particle size of 2 $\mu$m, 0.5 to 1.5% by weight MgO, 1 to 3% by weight $Al_2O_3$, 20 to 30% by weight $SiO_2$. To 100 parts by weight of the powdery mixture, were added 5 to 10 parts by weight of polyvinylbutyral, 124 parts by weight of trichloroethylene, 32 parts by weight of tetrachloroethylene, 44 parts by weight of n-butyl alcohol, and 2 parts by weight of butyl butylphthalglycolate and wet mixed with a ball mill for 24 hours to produce a slurry. The slurry was conditioned to an appropriate viscosity by vacuum deaeration treatment. The conditioned slurry was applied with a doctor blade onto a silicone-coated polyester film to a thickness of 0.5 mm and then dried to produce a green sheet.

Then, the green sheet was provided with holes having a diameter of 100 $\mu$m, into which conventional tungsten paste was filled. Eight plies of these sheets prepared as described above were laminated with their positions being matched, and adhered under pressure by a hot press. The hot pressing conditions were at a temperature of 120° C. and a pressure of 50 kgf/mm$_2$. The laminates prepared in this way were heated at a rising rate of temperature of 50° C./hr. to remove the binder and fired at a temperature of 1640° C. for one hour in an atmosphere of gaseous nitrogen containing steam and hydrogen. Then, both sides of each ceramic substrate were polished to smoothness and cut into a specimen of 15 mm square.

Then, a paste for glazing treatment was prepared by formulating a powdery mixture consisting of 70% by weight particulate borosilicate glass having an average particle size of 5 $\mu$m and 30% by weight particulate $Al_2O_3$ having an average particle size of 1 $\mu$m, adding to 100 parts by weight of the powdery mixture 30 parts by weight of a methacrylate based binder and 100 parts by weight of butylcarbitol acetate, and then mixing the whole with a RAIKAI mixer for 30 minutes to condition the mixture to an appropriate viscosity. The particulate glass used in this paste had a composition consisting of 70 to 80% by weight $SiO_2$, 10 to 20% by weight $B_2O_3$, 1 to 5% by weight $K_2O$, and 0.1 to 0.5% by weight ZnO. The resultant paste for glazing was printed onto one side of the ceramic substrate as prepared above and fired at a temperature of 900° C. for one hour in an atmosphere of nitrogen containing steam. The glazed surface was polished to a desired flatness and any voids present in the ceramic substrate were filled. The thus produced ceramic substrates were employed as carrier substrates.

On the surface of the ceramic substrate with voids having been filled, aluminum was deposited to a thickness of 0.2 $\mu$m by vacuum deposition. A resist was applied onto the top of the aluminum coating, applied with a glass mask, exposed to light, developed, and thereafter, the aluminum was etched. Finally, the remaining resist was removed.

Then, the substrate was coated with $Ta_2O_5$ by sputtering to a thickness of 1 $\mu$m. Furthermore, a resist was applied onto the $Ta_2O_5$ film, exposed, developed, and then the $Ta_2O_5$ film was patterned by ion milling. Thereafter, on the $Ta_2O_5$ film, aluminum was further vapor-deposited to a thickness of 1 $\mu$m, applied with a resist, exposed, developed, and then the aluminum was etched, and the resist was removed to produce a thin film capacitor. Areas for connection with the LSI were coated with Ti-PT-Au by sputtering, on which photosensitive polyimide was applied, exposed, developed, and then heat-treated at 400° C. to make a protective film.

Figure 2:
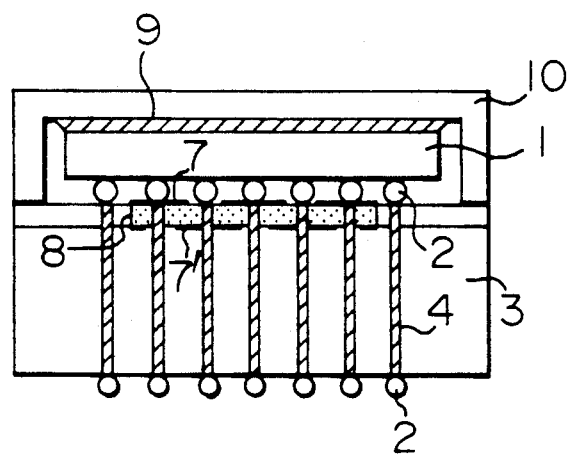
FIG. 2 is a diagrammatical view of a package comprising capacitors formed on a carrier substrate.
Figure 3:
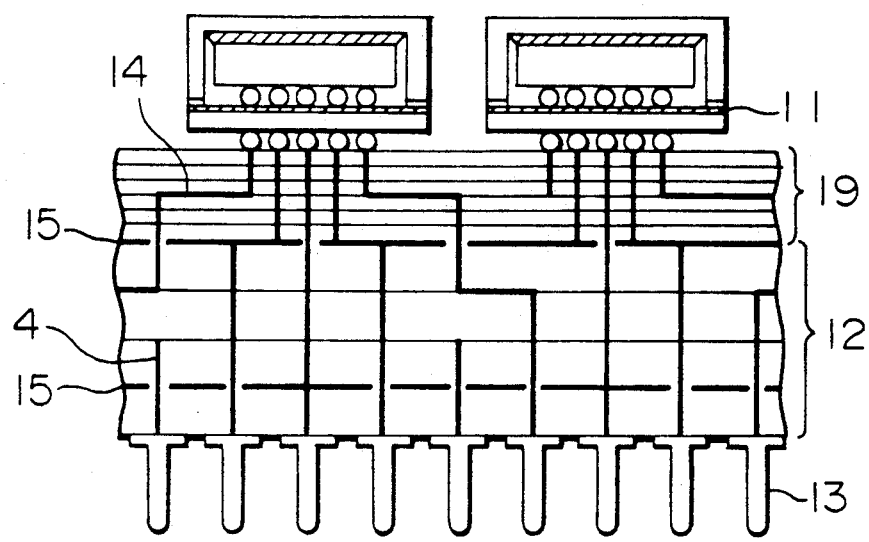
FIG. 3 is a diagrammatical view of a module.
Figure 4:
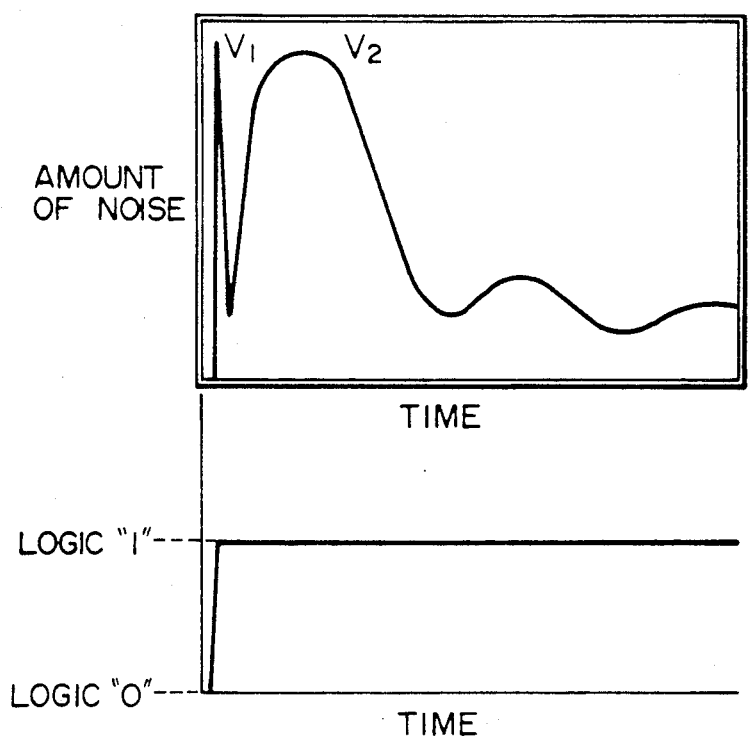
FIG. 4 is a graphical illustration showing a relationship between the amount of noise and the amplitude of a logical signal as a function of time.
Figure 5:
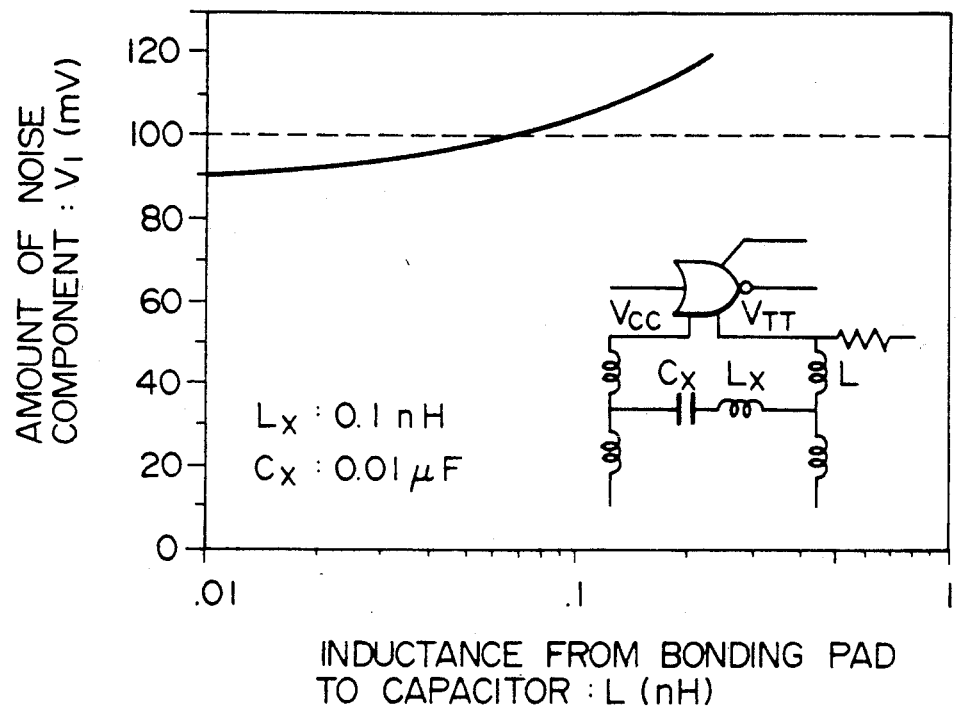
FIG. 5 is a graphical illustration showing a relationship between the inductance from a bonding pad to a capacitor in LSI and the amount of the noise component $V_1$.

The structure of the thin film capacitor containing ceramic board as manufactured above is shown in FIG. 1. Then, the LSI was connected to the board by soldering (flip chip bondings), and the board and LSI were capped with a AlN cap 10 by soldering 9, as seen in FIG. 2. The resulting package was soldered onto a module board, as seen in FIG. 3.

The module board comprises a ceramic multi-layer circuit board 12 having a thin film polyimide-copper multi-layer circuit 19 formed thereon. The ceramic multi-layer circuit board 12 was composed of a laminate having 30 layers of ceramic substrates prepared by the identical procedure as the ceramic substrate described above. In this case, the ceramic multi-layer circuit board had power supply layers formed. The module board had pins 13 soldered for output and input of electrical signals. This module is diagrammatically shown in FIG. 3.

Capacitors were electrically connected to the power supplies Vcc and Vtt of the ECL circuit with the capacitors being disposed therebetween. That is, one of the electrodes of each capacitor was connected to Vtt and the other was connected to Vcc. The thus fabricated thin film capacitor containing ceramic board had solder connections (flip chip bondings) which couple the LSI with the board. The connections have an equivalent inductance of about 0.02 nanohenry. The inductance of the thin film capacitor itself having the structure as shown in FIG. 1 was about 0.05 nanohenry. The capacitance of the capacitor was 0.04 $\mu$F. When the boards were incorporated in the module of a large type computer, the provision of the capacitors enabled the fast rising noise component $V_1$ generated between the power supplies Vtt and Vcc to be lowered about 50% as compared with the case having no capacitor connected.

On the board having the capacitors formed thereon there was loaded a memory LSI containing a BiCMOS circuit. The capacitors were connected between and to the power supply potential of the BiCMOS circuit and the earth potential. The LSI loaded board was incorporated in a large type computer which generated noise from the power supply system owing to the inductance thereof and through-currents in an amount of about 50% lower than in the case having no capacitor connected.

Furthermore, a board substrate having capacitors formed thereon was coated with a polyimide insulating layer and perforated to form through-holes connecting an upper layer with a lower one by using photolithography and sputtering. In addition, thin film resistors of a $Cr-SiO_2$ system were formed by sputtering. The thin film resistors acted as terminal resistors in the ECL circuit formed in the LSI. The formation of capacitors and terminal resistors on the board allows actual high density packages to be fabricated.

EXAMPLE 2

A powdery glass A having a composition, as measured by oxides, consisting of 12.9% by weight MgO, 1% by weight CaO, 40% by weight $Al_2O_3$, 42.1% by weight $B_2O_3$, and 4% by weight $SiO_2$ and having an average particle size of 5 $\mu$m, a powdery glass B having a composition, as measured by oxides, consisting of 78.0% by weight $SiO_2$, 18.8% by weight $B_2O_3$, 3% by weight $K_2O$, and 0.2% by weight ZnO and having an average particle size of 5 $\mu$m, and $Al_2O_3$ particles having an average size of 1 $\mu$m were mixed in a proportion of 35% by weight of the powdery glass A, 35% by weight of the powdery glass B, and 30% by weight of $Al_2O_3$ to produce a powdery mixture, to which 20 parts by weight of a methacrylate based binder, 99 parts by weight of trichloroethylene, 26 parts by weight of tetrachloroethylene, and 1 parts by weight of di-n-butyl phthalate were added and wet mixed with a ball mill for 24 hours to produce a slurry. A green sheet was prepared using the same procedure as in Example 1. The green sheet was perforated as in Example 1 to form holes of 100 $\mu$m$\phi$. These holes were filled with a paste. The paste was a conventional copper paste where 95% or more of the component remaining after organic materials were removed were copper. Then, 8 plies of sheets were laminated to produce a laminate which was fired at 980° C. for one hour in an atmosphere of nitrogen containing 20% by volume of steam. The thus produced ceramic substrate was polished on both sides to a desired flatness. On the substrate was formed a thin film capacitor as in Example 1. The dielectric material used in the thin film capacitor was $SrTiO_2$ and had a thickness of 1 $\mu$m. The electrodes were of aluminum.

The thus fabricated capacitor containing board was connected to an LSI by soldering as shown in FIG. 1, and capped with a LSI cap by soldering, as shown in FIG. 2. The resulting package was soldered onto a module board, as seen in FIG. 3.

The module board comprises a glass ceramic multi-layer circuit board 12 having a thin film polyimide-copper multi-layer circuit 19 formed thereon. The glass ceramic multi-layer circuit board 12 was fabricated as follows. The green sheets of glass ceramics as described above were perforated to form holes therein, into which the copper paste was filled, and printed with the viscosity conditioned copper paste to form line circuits for signals and conductive layers for power supplies thereon. The 60 plies of the thus produced substrates were fired in the identical procedure as described above. The thus fabricated module board was soldered with pins as in Example 1. In this way the module was fabricated.

The capacitors were connected between the power supplies Vcc and Vtt as in Example 1. The flip chip bondings had an equivalent inductance of about 0.02 nanohenry. An equivalent inductance of the fabricated thin film capacitor itself was about 0.05 nanohenry. A capacitance of the capacitor was 0.15 $\mu$F. For an amount of the noise generated between the power supplies Vtt and Vcc, the provision of the capacitor enabled the noise component $V_1$ rising approximately as fast as the rising speed of signals to be lowered about 50% as compared with the case having no capacitor connected, and the noise component $V_2$ appearing after the component $V_1$ to be lowered to about 1/10 of that in the case having no capacitor provided.

EXAMPLE 3

To 100 parts by weight of a powdery mixture, as a ceramic batch, consisting of 97% by weight particulate AlN having an average particle size of 1 $\mu$m and 3% by weight $Y_2O_3$ were added 5 to 10 parts by weight of polyvinylbutyral, 124 parts by weight of trichloroethylene, 32 parts by weight of tetrachloroethylene, 44 parts by weight of n-butyl alcohol, and 2 parts by weight of butyl butylphthalylglycolate, and wet mixed with a ball mill for 24 hours to produce a slurry. Green sheets were made from the slurry in the same manner as in Example 1 and perforated to form holes, into which a tungsten paste was filled. The sheets were laminated to produce a laminate, which was fired at 1900° C. for one hour in an atmosphere of gaseous nitrogen. After both sides of the laminate were polished, on the resultant substrate there was made a thin film capacitor having a dielectric material of $Ta_2O_5$ of a thickness of 1 $\mu$m in the identical procedure as in Example 1. The resultant board having an LSI and an AlN cap soldered thereto was soldered onto the module board as in Example 1 and pins for output and input of electrical signals were also soldered thereto. The fabricated capacitor itself has an inductance of about 0.05 nanohenry and a capacitance of 0.04 $\mu$F. For an amount of the noises generated between the power supplies Vtt and Vcc, the provision of this capacitor enabled the fast rising noise component $V_1$ to be lowered about 50% as compared with the case having no capacitor connected, and the following component $V_2$ to be lowered to about 30% of that in the case having no capacitor provided.

EXAMPLE 4

Mullite substrates having through-holes were made in the same procedure as in Example 1. The through-hole conductor was of tungsten, and the mullite substrates were polished on both sides to a desired flatness. Moreover, a Ag-Pd conductor paste was printed to form the lower electrode. An amount of Pd in the Ag-Pd paste used was 15% by weight. Geen sheets having a thickness of 50 $\mu$m were made from a dielectric material in the same manner as in Example 1. The dielectric material used as starting material was of $Pb(Fe_{1/2}Nb_{1/2})O_3$-$Pb(Fe_{2/3}W_{1/3})O_3$-$PbTiO_3$ system ceramics having a specific dielectric constant of about 10,000. Then the green sheets were perforated to form holes, and adhered under pressure to the mullite substrate with the holes being matched in position with the through-hole pattern of the mullite substrate.

The same Ag-Pd conductor paste as described above was filled into the holes made in the green sheet of the dielectric material and printed of the top of the sheet to form the upper electrode. The sheets were fired at 900° C. in air, and a polyimider protective film was applied.

To the resulting board was connected an LSI by soldering, and the board and the LSI were capped with an AlN cap by soldering. The resulting package was soldered onto a module board. The module board was identical to that employed in Example 1.

The capacitors were connected to the power supplies of the LSI as in Example 1. An equivalent inductance of the fabricated capacitor itself was about 0.3 nanohenry. A capacitance of the capacitor was 0.03 μF. The provision of the capacitors enabled the fast rising noise component $V_1$ generated between the power supplies Vtt and Vcc to be lowered to about 75% of that in the case having no capacitor provided.

EXAMPLE 5

A powdery glass having a composition, as measured by oxides, consisting of 23.0% by weight MgO, 25% by weight $Al_2O_3$, 50% by weight $SiO_2$, and 2% by weight $B_2O_3$ and having an average particle size of 5 μm was employed as starting material to produce green sheets in the same procedure as in Example 2, which green sheets were perforated to form holes, and the holes were filled with a copper paste. The copper paste was printed to form signal circuits and a ground layer. Therefore, 60 plies of the sheets were laminated to produce a laminate which was fired at a temperature of 900° to 1000° C. in an atmosphere of nitrogen containing 20% by volume of steam.

The thus produced ceramic multi-layer circuit substrate was made flat in the same manner as in Example 1, and cut into 100 mm squares. On this substrate was vapor-deposited Ti(0.1 μm)-Pt(0.1 μm)-Au(0.3 μm), and then sputtered tantalum to a thickness of 0.5 μm, which was patterned by ion-milling.

Then the tantalum layer was converted by anodic oxidation to $Ta_2O_5$ to a depth of 0.2 μm. The anodic oxidation is a method of oxidizing the tantalum on the substrate in an electrolyte such as an aqueous phosphoric acid solution under an applied voltage with the tantalum being used as an anode. The thus produced $Ta_2O_5$ film was coated by vapor-deposition with Ti(0.2 μm)-Pt(0.2 μm)-Au(1 μm)

Furthermore, on the top there was formed a polyimide film as a protective film and patterned by a photolithography technique.

The LSI was soldered onto the board obtained as described above. The capacitors were connected to the LSI in the same manner as in that Example. The inductance from the bonding pads of the LSI to the capacitors was 0.05 nanohenry. The capacitance of the capacitor was 2 μF. The provision of the capacitors enabled the fast rising noise component $V_1$ generated between the power supplies Vtt and Vcc to be lowered to 50% as compared with the case having no capacitor connected, and the noise component $V_2$ to be lowered to about 10%.

EXAMPLE 6

On the ceramic multi-layer circuit substrate fabricated in Example 5 was vapor-deposited Ti(0.1 μm)-Pt(0.1 μm)-Au(0.5 μm) in the same procedure as in Example 5, and then sputtered tantalum to a thickness of 0.5 μm, which was anodized to form a $Ta_2O_5$ film having a thickness of 0.2 μm. Then a pattern of aluminum film having dimensions of 6 mm square was applied onto the $Ta_2O_5$ film by a photolithography process. The electrode 7 of the capacitor formed on the ceramic substrate 3 was devided as shown in FIG. 11.

The distance between adjacent aluminum electrodes having dimensions of 6 mm square was 0.5 mm.

Then, a polyimide film serving as a protective film was formed on the aluminum electrodes as in Example 5 and patterned. The LSI was soldered onto this substrate. The capacitors were connected to the power supplies of the LSI in the same manner as in Example 1.

An inductance from the bonding pad of the LSI to the capacitor was 0.05 nanohenry. The electric properties on the side of the capacitor viewed from the connections to the bonding pads of Vtt and Vcc of the LSI generated a resonance at about 500 MHz when the capacitor was divided equivalently into small capacitors. An impedance at 0.5 to 1.5 GHz was not higher than 0.5 Ω, and the fast rising noise component $V_1$ could be lowered to 40%. Moreover, separation of failed portions due to pinholes and the like from the LSI power supply lines with a laser and the like could achieve an enhancement in yield by a factor of 10 without deterioration of the performance.

EXAMPLE 7

Green sheets of glass ceramics made in Example 2 were perforated to form holes using the identical procedure as in Example 1, into which holes a copper paste was filled. Then the copper paste was printed to form signal circuits or a ground layer. 60 plies of these sheets were laminated as in Example 1 to produce a laminate, which was fired at 900° to 1000° C. in an atmosphere of gaseous nitrogen containing about 20% by volume of steam. Both sides of the thus produced substrate were polished to a desired flatness. Furthermore, a polyimide layer was formed and removed partly in the areas of through-holes by a photolithography technique, on which polyimide layer was plated a copper film. The copper film was etched to form a pattern of electrodes, and a thin organic polyimide film was formed by plasma enhanced polymerization. The thin organic film has a specific dielectric constant of about 4 and a thickness of 1 μm. Furthermore, the thin organic film was masked and partly removed in the areas of through-holes by ion-milling, and a copper film was plated on the thin organic film. The copper film was thereafter etched to form a pattern of electrodes, on which an identical protective film to that in Example 1 was applied.

Figure 10:
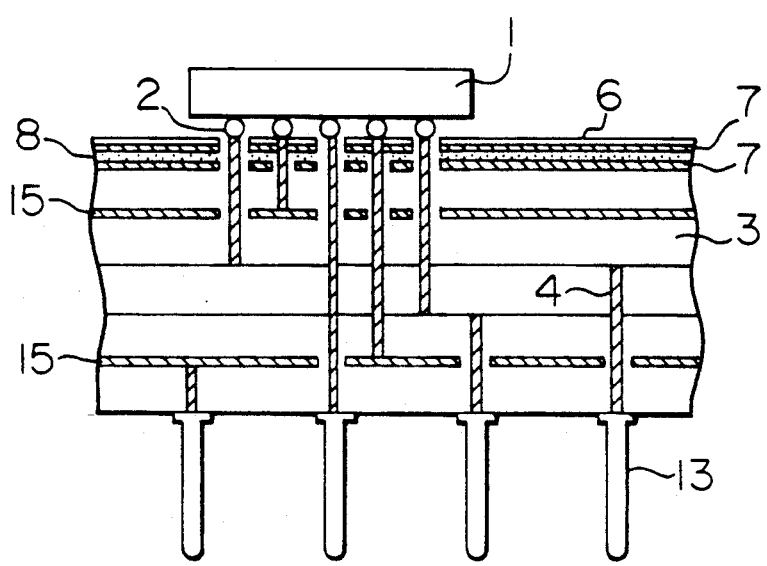
FIG. 10 is a diagrammatical view of a thin film capacitor formed on a module board.

On the thus fabricated board an LSI was loaded using flip chip bondings to produce a structure as shown in FIG. 10. The connections of the capacitors were similar to those in Example 1. The inductance from the bonding pad of the LSI to the capacitor was 0.05 nanohenry. The capacitance of the capacitor was 0.2 μF. The provision of the capacitor enabled the fast rising noise component $V_1$ generated between the power supplies Vtt and Vcc to be lowered about 50% as compared with the case having no capacitor connected.

EXAMPLE 8

Five plies of green sheets as made in Example 3 were laminated and adhered under pressure to form a laminate which was fired at 1900° C. for one hour in an atmosphere of nitrogen. Both sides of the laminate were polished into a plate having a thickness of 0.5 mm, onto which aluminum was sputtered to a thickness of 0.2 μm. Then, $Ta_2O_5$ was sputtered to a thickness of 0.5 μm. The $Ta_2O_5$ film 8 was patterned by a ion-milling. Thereafter, aluminum was sputtered to a thickness of 0.2 μm. and patterned by ion-milling. Then Ti-Pt-Au was vapor-deposited to form connections. An AlN plate was processed to use as a heat sink fin 16.

The board having capacitors formed as described above was connected to an LSI by a TAB connecting mode. Film leads 18 were plated with tin, and the connections of the LSI and the capacitors were formed with Au-Sn. The LSI had a BiCMOS circuit formed therein, and the capacitors were connected to the power supply potential of the BiCMOS circuit and the earth potential.

The LSI was soldered to an AlN substrate to produce a structure as shown in FIG. 12. The amount of noise generated from the power supply was reduced to about 60% of that the case having no capacitor connected. This module employed an AlN substrate of low thermal resistivity so that the LSI could be effectively cooled. If a lower thermal resistivity is desired, a thermal conductive grease or the like may be applied between the LSI and the capacitors.

EXAMPLE 9

Figure 13:
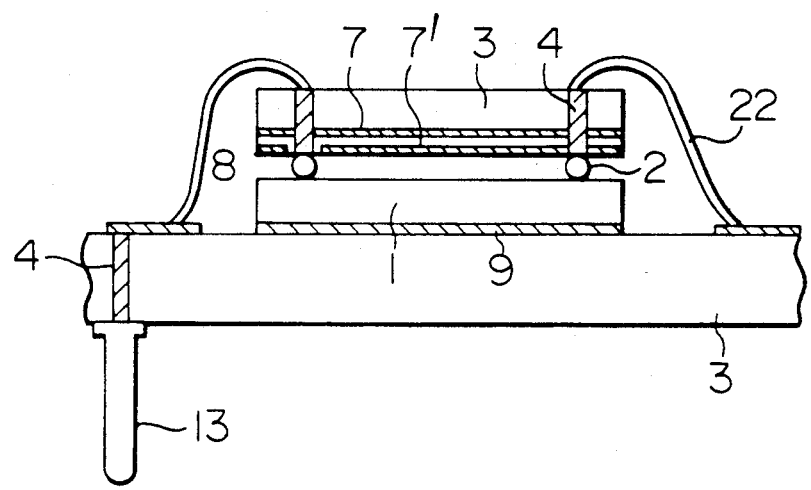
FIG. 13 is a diagrammatical view of the structure of a capacitor formed for wire bonding connection.

Capacitors were formed on a mullite substrate as in Example 1. On the resultant board was soldered an LSI. The opposite side having no capacitor formed of the mullite substrate was partly plated with gold in the areas of the through-holes. The LSI was soldered to an Al$_2$O$_3$ substrate with wire distribution being made by wire-bondings 22 to produce a structure as shown in FIG. 13. The LSI had a BiCMOS circuit formed therein, and the capacitors were connected to the power supply potential of the BiCMOS circuit and the earth potential. The amount of noise generated from the power supplies was reduced to about 50% of that in the case having no capacitor connected.

EXAMPLES 10

A polyimide insulating layer 23 was formed on the mullite substrate 3 made in Example 1, and through-holes 4 connecting the upper layer and the lower layer and thin film resistors 24 were formed therein. The resistor materials were of a Cr-SiO$_2$ system. The thin film resistors functioned as terminal resistors in the ECL circuits formed within the LSI.

Figure 14:
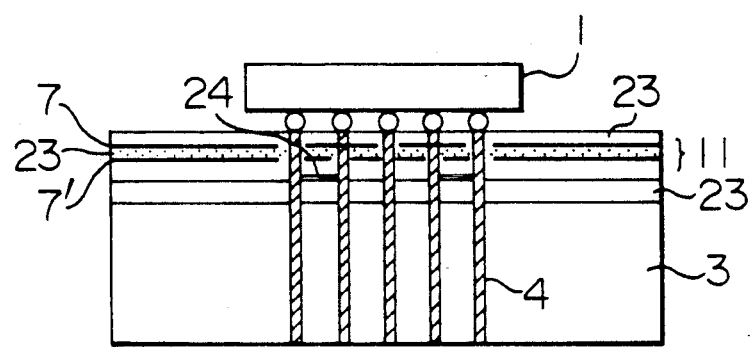
FIG. 14 is a diagrammatical view of the structures of a thin film resistor and a thin film capacitor formed on a carrier substrate.

As can be seen in FIG. 14, on the polyimide layer were formed capacitors containing a dielectric material of polyimide in the manner as in Example 7. The dielectric material had a thickness of 0.8 μm. The capacitance of the capacitor was 5 nF. The inductance from the bonding pads of the LSI to the capacitors was 0.05 nanohenry. The provision of the capacitors enabled the fast rising noise component V$_1$ in the terminal resistor-simultaneous switching noise to be lowered to about 60%.

EXAMPLE 11

A polyimide layer having through-holes 4 was formed on a mullite substrate in the same manner as in Example 10. Moreover, thin film resistors 24 were produced by a sputtering process.

Figure 15:
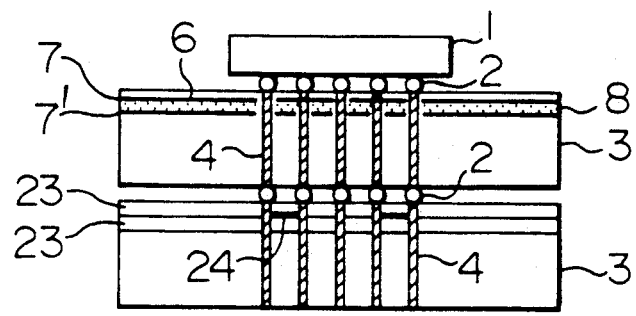
FIG. 15 is a diagrammatical view of a connection structure in the case of a capacitor formed on a carrier substrate.

On the mullite substrate 3 were formed capacitors using the identical procedure as in Example 1. Furthermore, on the bottom surface of the mullite substrate on which the capacitors were formed there was soldered the mullite substrate 3 having the aforementioned thin film resistors 24 as shown in FIG. 15. Such a structure allowed the yield to be enhanced as compared to the case where capacitors and thin film resistors were formed in the same surface of a substrate.

EXAMPLE 12

Figure 16:
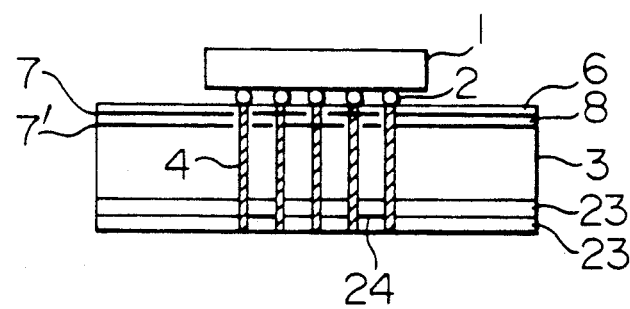
FIG. 16 is a diagrammatical view of the structures of capacitors and thin film resistors formed on opposite sides of a carrier substrate, respectively.

On the mullite substrate were formed thin film capacitors as in Example 1. Furthermore, on the side having no capacitor there were formed thin film capacitors in the same manner as in Example 10 to produce a structure as shown in FIG. 16. Such a structure permits an increased actual package density and a reduction in the amount of connections which enables an enhancement in reliability.

EXAMPLE 13

Figure 17:
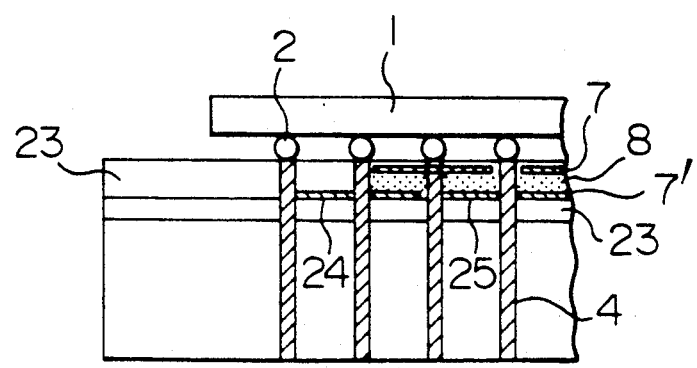
FIG. 17 is a diagrammatical view of the structures of a thin film resistor and a thin film capacitor formed on the same substrate.

A mullite substrate was polished to a desired flatness as in Example 1 and was sputtered with tantalum. The tantalum film was patterned by ion-milling. Then nitrogen ions were implantated into a portion of the tantalum pattern, thereby converting the tantalum into tantalum nitride so as to produce thin film resistors 24. The remaining tantalum was anodized to form capacitors in the same manner as in Example 5 to produce a structure as shown in FIG. 17. Such a structure enables an integration of the terminal resistors and the thin film capacitors.

EXAMPLE 14

The glass ceramic multi-layer substrate made in Example 7 was provided with a thin film multi-layer circuit containing lines for signals, a power supply layer and a ground layer made of copper using polyimide as an insulating material. On this substrate there was soldered the mullite substrate having thin film capacitors and thin film resistors fabricated as in Example 1. The LSI having a BiCMOS circuit or an ECL circuit was soldered onto the mullite substrate by flip chip bondings. The mullite substrate was a carrier substrate for the LSI. The carrier substrate was capped with an AlN cap, and the resulting multi-layer circuit board was connected to the power supply substrate and a heat sink to manufacture a module for a large type electronic computer. The computer could work normally with an amount of noise not higher than 100 mV even with a signal rising time of 500 picoseconds or less.

EXAMPLE 15

Examples of the present invention will now be described with reference to FIGS. 18, 19-a, 19-b, 19-c, and 20.

Figure 18:
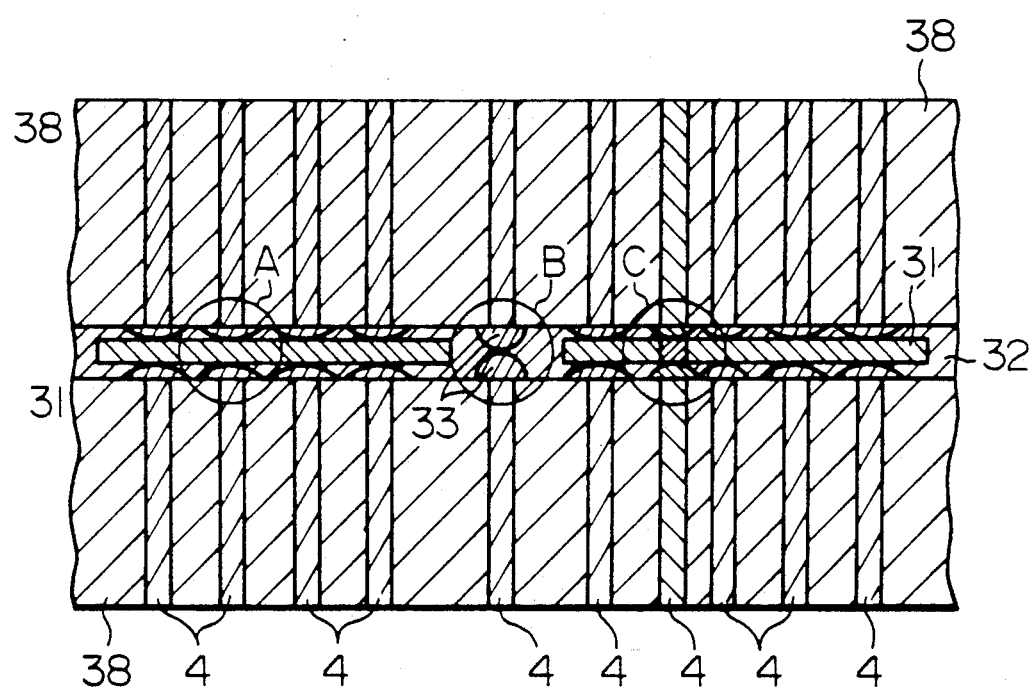
FIG. 18 is a cross-sectional view of the structure of an embodiment of the present invention.

FIG. 18 is a cross-sectional view of an Example of the present invention. FIGS. 19-a, 19-b, and 19-c are an enlarged cross-sectional view of a part of FIG. 18. In the drawings, 31 designates a capacitor section, 32 a glass layer, 33 a connecting project, 34 a capacitor-penetrating line, 35 a tantalum pentoxide, 36 an aluminum electrode layer, 37 a glass member, and 38 an alumina substrate.

The structure of this Example has an arrangement that two alumina substrates 38 sandwich capacitor section 31. Two alumina substrates 38 and a capacitor section 31 are joined by a glass layer 32. The lines include through-holes 4, i.e., connections to capacitors within capacitor section 31, and through-holes 4 connecting no capacitor and which include those passing via capacitor section 31 and those bypassing the section. These three cases are partly shown in enlarged scale in FIGS. 19-a to 19-c.

Figure 19A:
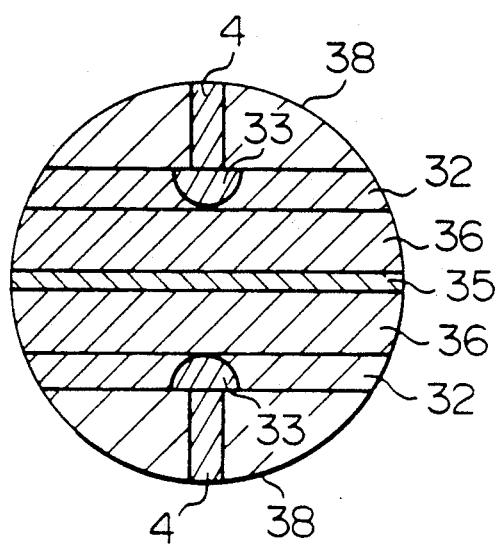
FIGS. 19a to 19c are enlarged partial cross-sectional views of the structures of embodiments of the present invention.
Figure 19B:
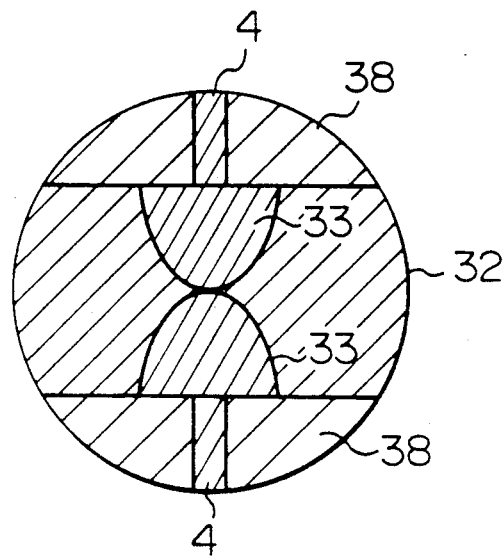
Figure 19C:
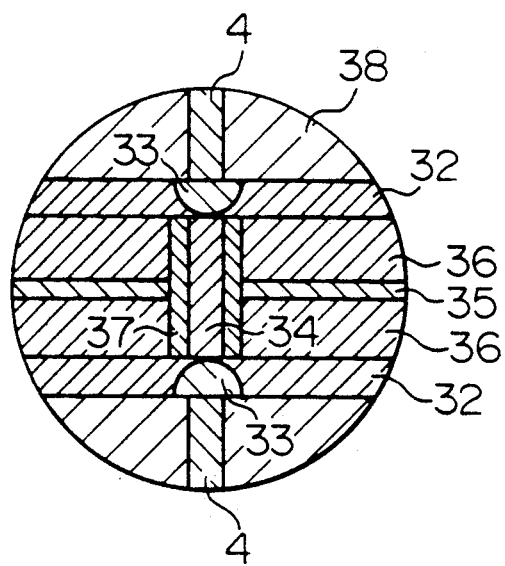

FIG. 19-a shows a part of the lines connected to a capacitor. Connecting projects 33 (these can be produced by firing a tungsten paste similarly to the through-holes 4) projecting from through-holes 4 within upper and lower alumina substrates 38 are in contact with aluminum electrodes 36, which are electrodes of the capacitor. The aluminum electrodes 36 have a thickness of 5 μm. Two aluminum electrodes 36 sandwich a thin tantalum pentoxide film 35 which has a thickness of about 0.1 μm. The Dielectric layer of the capacitor should be desirably as thin as possible from the point of view of capacitance. However, a thickness of 0.1 μm or less may not produce a perfectly continuous film, nor a good capacitor. A higher thickness is advantageous for insulating property, but reduces the capacitance.

FIG. 19-b shows a part of the lines but passing any capacitor. Connecting projects 33 (these can be produced by firing a tungsten paste similarly to through-holes 4 not connecting to any capacitor) projecting from through-holes 4 within upper and lower alumina substrates 38 are in contact with each other. In this part, the projecting amount of the projects is one half (about 5 μm) of the total of the thicknesses of aluminum electrodes 36 and tantalum pentoxide layer 35, which is larger than the projecting amount shown in FIG. 19-a.

FIG. 19-c shows a part of the lines piercing capacitor section 31. Connecting projects 33 projecting from through-holes 4 within upper and lower alumina substrates 38 are in contact with capacitor-piercing line 34. This capacitor-piercing line has a length of 10.1 μm. In order to insulate electrically the capacitor-piercing line 34 from the aluminum electrodes 36 as the electrodes of the capacitor and tantalum pentoxide layer 35, glass members 37 surround capacitor-piercing line 34. The specific dielectric constant of the glass member 37 is about 10, which is lower than the specific dielectric constant 25 of tantalum pentoxide layer 35 to aid in reducing transmission delay.

An Example of the process for production according to the present invention will be illustrated.

(i) First, there are provided a pair (two) of fired alumina substrates 38 having through-holes 4, through-holes 4 not connecting to any capacitor, and connecting projects 33, which have been produced by simultaneously firing green alumina substrates having through-holes filled with a tungsten paste and projects consisting of the tungsten paste.

(ii) A required number of composites having capacitor section 31 sandwiched with glass layer 32 are provided (two of them are shown in FIG. 18).

(iii) The composites having capacitor section 31 sandwiched with glass layer 32 are disposed between alumina substrates 38 with their positions being matched, and are heated under pressure at 500° C. in an atmosphere of nitrogen to fuse the glass for adhesion.

Now a process for producing the composite having capacitor section 31 sandwiched with glass layer 32 will be described. Any specific explanation of the alumina substrate 38 will not be necessary, and therefore, will be omitted.

(i) An electrode is formed on a substrate, on which a further dielectric layer is formed to produce a half part of a capacitor. A pair (two) of the half parts are provided.

(ii) Onto the top layer, tantalum pentoxide 35, (thickness: 0.04 μm) was applied as a sol material obtained by hydrolyzing tantalum alkoxide by a spinner to a thickness of 0.01 μm. With the sol material as a bonding material, a pair of the half parts are adhered to each other.

(iii) The whole is heat-treated at 400° C. simultaneously to evaporate the solvent alcohol and decompose the bonding material resulting in the complete production of the composite having capacitor section 31 sandwiched with the glass layer.

Next a process for producing the half part of the capacitor will be described.

(i) An adhesive is applied onto a glass substrate having a thickness of 0.5 mm.

(ii) A glass film of low melting point material having a thickness of 10 μm is applied.

(iii) An aluminum film having a thickness of 5 μm is supplied as aluminum electrode 36.

(iv) A tantalum alkoxide is hydrolyzed to produce a sol material which is applied with a spinner. In one application, a thin tantalum pentoxide layer having a thickness of 0.01 μm is produced.

(v) The procedure of step (iv) is repeated four times.

Figure 20:
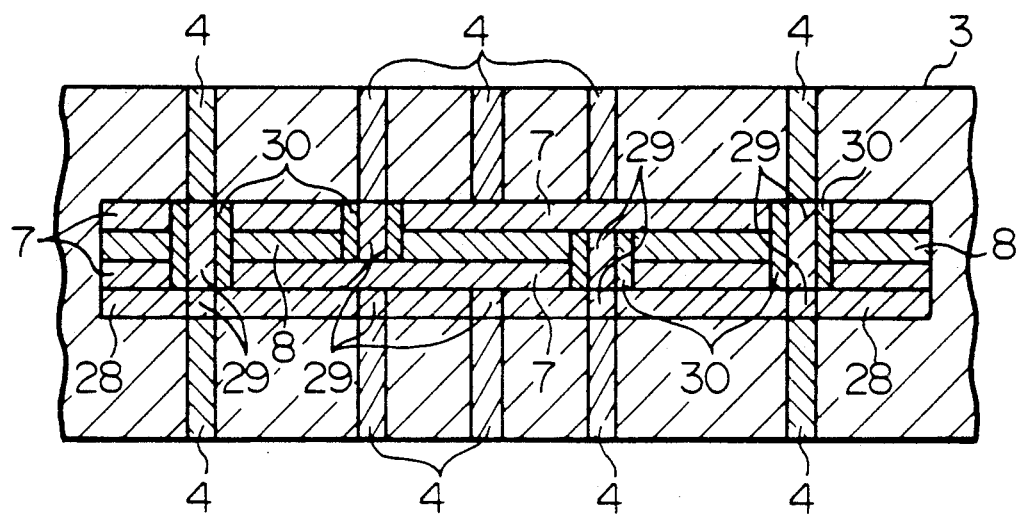
FIG. 20 is a diagrammatical partial cross-sectional view of a module containing capacitors.

The thin tantalum pentoxide film obtained in this Example had a specific dielectric constant of 25 and a dielectric loss of 0.5% at 1 GHz, and exhibited excellent properties at high frequencies. The thin film thickness of 0.1 μm allowed an achievement of a large capacitance of 0.2 μF for a square of 10 mm side. Depending upon the circuit scheme, a capacitance required for preventing noise at about 100 MHz is 0.1 μF. In this Example, a sufficient capacitance could be achieved by using tantalum pentoxide which has a relatively low specific dielectric constant. By using the same process as above, patterning was performed by ion-milling and the like to fabricate capacitor-containing boards as shown in FIG. 20.

The use of the coating method for forming the thin dielectric films in this Example is advantageous for enlargement of the surface area of the boards. As a matter of course, general methods for forming thin films, such as sputtering, vapor-deposition, or plating may be employed. However, vacuum is a reducing atmosphere, under which the sputtering and the vapor-deposition tend to remove a part of the oxygen from the tantalum pentoxide during deposition of the films. It is, the tantalum pentoxide layer is apt to deviate from the stoichiometric composition. An attempt may be required to perform sputtering with an addition of oxygen, or to form films under irradiation with oxygen ions, i.e., to effect ion-mixing. Plating may cause deterioration of the insulating property owing to occlusion of hydrogen into the films or to ease of inclusion of other impurities. In post treatment after plating, any measurement may be required to effect.

Aluminum electrodes 36 are supplied in the form of foil, though they may be provided by using a thin film forming technique such as vapor-deposition, plating, and the like. The use of foil supplied for the electrodes is suitable for enlargement of the surface area of the boards as by using coating methods. For higher speed of operation of computers, an effort has been made to reduce the number of substrates. In such case, an area of a board tends to be enlarged. This Example of the present invention is a process for production of boards in conformity with this tendency.

As previously described, noise is generated by variation in power supply voltage owing to switching and crosstalk. Suppression of switching noises allows almost all circuits to work normally. In order to suppress the variation in power supply voltage, insertion of a capacitor between the power supply line and the earth line, a so-called a smoothing capacitor, is effective. In this Example, the lines are designed to dispose the capacitor between the power supply line and the earth line.

As previously indicated, the aluminum electrode 36 has a film thickness of 5 μm, and a layer resistance is 0.05 Ω or less. A layer resistance higher than 0.5 Ω causes a reduction in smoothing effect of the capacitor at high frequencies. The layer resistance in this Example is sufficiently lower than the upper limit thereof.

EXAMPLE 16

An Example of the present invention will be illustrated with reference to FIG. 21. 36 designates an aluminum electrode 36, 39 a mullite substrate, 40 an aluminum electrode line, 41 aluminum piercing lines, 42 a polyimide layer, and 43 an oxide composite of barium-lead-neodymium-titanium.

Figure 21:
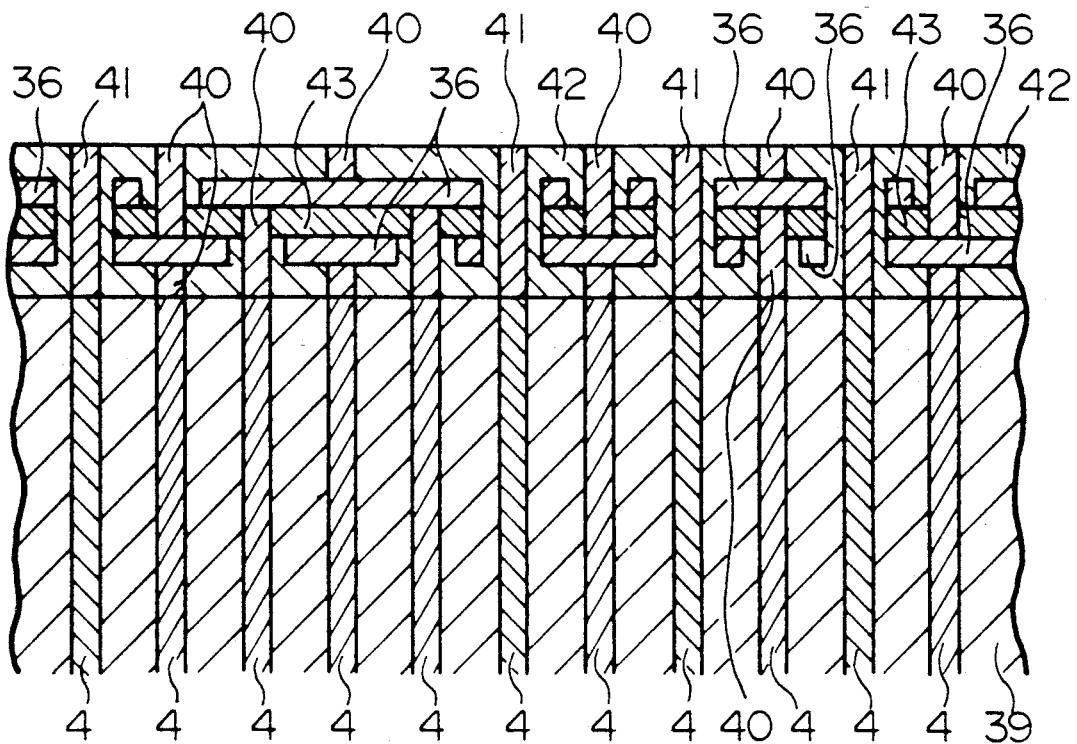
FIG. 21 is a diagrammatical cross-sectional view of capacitors formed on a substrate.

The structure shown in FIG. 21 comprises an arrangement where a capacitor-containing layer with lines is laminated onto the surface of mullite substrate 39 which has lines provided therein by simultaneous firing of tungsten. The use of an oxide composite of barium-lead-neodymium-titanium (BaO-PbO-$Nd_2O_3$-4$TiO_2$) 43 having a specific dielectric constant as high as about 90 at 1 GHz as well as excellent properties at high frequencies as the dielectric material allowed an increase in capacitance of the capacitor. The film thickness is 0.1 μm. An oxide composite containing barium and titanium oxides have a relatively high specific dielectric constant and exhibit less reduction in dielectric constant as well as less increase in dielectric loss even at high frequencies not less than 1 GHz so that they are most suitable for dielectric materials in capacitors. Especially, among them, the oxide composite of barium-lead-neodymium-titanium (BaO-PbO-$Nd_2O_3$-4$TiO_2$) has advantageously a high value of εr of about 90. For ceramics to be used as substrate materials, mullite (3$A_2O_3$-2$SiO_2$) of a lower specific dielectric constant (εr=6.5) is used, and for insulation of the top layer with lines, polyimide 42 of a particularly lower specific dielectric constant (δr=3.5) is used to make a structure having a minimum transmission delay.

Electrode materials in capacitors are aluminum as in Example 15. Although the use of copper having a lower resistivity is preferred for electrodes, copper is reactive with polyimide and incapable of withstanding the heat-treatment in air effected during the formation of the oxide composite of barium-lead-neodymium-titanium 43, which discouraged the use of copper. The thicknesses of the polyimide and the aluminum films were both 5 μm.

A process for production according to the present invention will now be briefly described.
(i) A mullite substrate 39 having through-holes formed therein is provided.
(ii) On one surface of the substrate (upper surface in FIG. 21) is applied a first polyimide layer 42 with a spinner.
(iii) The layer is cured to a maximum temperature of 35° C. in nitrogen, and etched in the areas on the surfaces of through-holes 4 to expose the surfaces of through-holes 4.
(iv) Aluminum is vapor-deposited throughout the top surface, and the deposited aluminum in other areas than those on the surfaces of the aforementioned (which will be used for aluminum electrode lines 40 and aluminum piercing lines 41) holes and aluminum electrodes 36 are etched out.
(v) Oxide composite of barium-lead-neodymium-titanium 43 is formed. Details of the process therefor will be described later.
(vi) Unnecessary portions of the oxide composite of barium-lead-neodymium-titanium 43 are etched out by ion-milling.
(vii) Aluminum electrode lines 40, aluminum piercing lines 41, and aluminum electrodes 36 for upper electrodes of capacitors are produced by vapor-depositing aluminum and patterning.
(viii) Finally, a top polyimide layer 42 is applied and etched to expose upper ends of aluminum electrode lines 40 and aluminum piercing lines 41 to complete the whole structure.

The next place, a process for producing the oxide composite of barium-lead-neodymium-titanium (BaO-PbO-$Nd_2O_3$-4$TiO_2$) 43 will be explained.
(i) 1.37 g (0.01 mol) of barium (Ba) and 80 ml of isopropyl alcohol (i-$C_3H_7OH$) are placed in a four neck flask equipped with a reflux condenser and heated in an oil bath at 80° C. for 30 minutes under reflux in an atmosphere of nitrogen. Barium alkoxide is produced in the solution.
(ii) A solution of 11.3 g (0.04 mol) of titanium alkoxide [Ti($OC_3H_7$)$_4$] dissolved in 100 ml of isopropyl alcohol (i-$C_3H_7OH$), a solution of 3.25 g (0.01 mol) of lead alkoxide [Pb($OC_3H_7$)$_2$] dissolved in 50 ml of isopropyl alcohol (i-$C_3H_7OH$), and a solution of neodymium alkoxide [Nd($OC_3H_7$)$_3$] obtained by dissolving 4.20 g (0.01 ml) of neodymium nitrate dissolved in 50 ml of isopropyl alcohol (i-$C_3H_7OH$) and reacting them at 80° C. for 30 minutes in an atmosphere of nitrogen are placed in three dropping funnels, respectively, which are attached to a four neck flask.
(iii) The solutions of Ti($OC_3H_7$)$_4$, Pb($OC_3H_7$)$_2$ and Nd($OC_3H_7$)$_3$ are simultaneously dropped into the flask for one hour. After being dropped, the reaction solution is maintained at 80° C. and stirred for two hours.
(iv) A solution of 1.26 g (0.07 mol) of water ($H_2O$) and 6 g (0.1 mol) of acetic acid ($CH_3COOH$) dissolved in 30 ml of isopropyl alcohol (i-$C_3H_7OH$) is dropwise added with a dropping funnel for 30 minutes.
(v) The reaction solution is stirred for two hours at 80° C., and thereafter, the reflux condenser is replaced by a Liebig condenser or the like to provide an apparatus capable of distilling under reduced pressure.
(vi) With the apparatus, the reaction medium, isopropyl alcohol (i-$C_3H_7OH$) is distilled out to concentrate the reaction solution to 100 ml.
(vii) The concentrated solution is applied using a spinner. In one application, a film having a thickness of 0.01 μm is obtained. For a completely continuous film, the application was repeated ten times in this Example.
(viii) The film is heat-treated at 400° C. for one hour in air to complete a thin BaO-PbO-$Nd_2O_3$-4$TiO_2$ film.

The oxide composite as in this Example is difficult to produce by a conventional process, such as vapor-deposition and sputtering, because the desired structure and composition are difficult to realize on a substrate. For example, sputtering with a target of an end composition (BaO-PbO-$Nd_2O_3$-4$TiO_2$) may cause destruction of bonds between oxides in the composite due to sputtering energy to produce on the substrate a material which has a quite different structure though its composition resembles the desired one. Alternatively, the end composition is placed in a crucible and evaporated or electroplated resulting in destruction of the structure during evaporation as in sputtering. As the components have different vapor-pressures, those having a lower vapor-pressure may preferentially be deposited to cause displacement in the composition. In order to avoid the displacement, an attempt has been proposed to evaporate the components separately from respective sources. In this case, it is not ensured that the evaporated components form the oxide composite on the substrate. Since a vacuum atmosphere has a reducing property, sputtering must be performed in a gaseous atmosphere containing oxygen instead of pure argon. The oxygen does not act positively, but simply suppresses the release of oxygen in the target. In this connection, there have been ion-mixing techniques to facilitate the oxidation by irradiating particles in the course of flying onto the substrate with oxygen ions during sputtering, ion-beam sputtering, or vapor deposition. In these cases, metallic elements may be used instead of their oxides to facilitate control of evaporation. Even these techniques do not ensure that the formed thin films on the substrate will correspond to the end oxide composite.

In contrast, the method of this Example does not include so many heating steps that the oxide composite will be decomposed so that thin films of the oxide composite having a thickness of not more than 1 μm can be relatively easily produced. At present the process of the present invention is a unique one capable of producing an oxide composite of 1 μm or less with high reproducibility.

The substrate of this Example can be loaded with ten LSI chips working at high speed. As previously stated, high speed circuits require capacitors disposed as near the noise generating sources or the sites susceptible to noise as possible. Moreover, there must not present be an interaction of noises between LSIs. In this Example, therefore, each LSI chip has a capacitor provided immediately under the chip. That is, ten capacitors are provided. For this reason, one capacitor has a dimension of 5 mm on a side which is smaller than in Example 15. However, the use of dielectric material having a higher specific dielectric constant resulted in a capacitance of 0.2 μF for each capacitor which is almost identical to that in Example 15. As indicated above, a capacitance of 0.1 μF or more has an effect of diminishing noise at 100 MHz or more. Therefore, the capacitors of this Example have a sufficiently high capacitance.

EXAMPLE 17

This Example employed a oxide composite of barium, titanium and tungsten ($BaO-4TiO_2-0.1WO_3$) as a dielectric material instead of the $BaO-PbO-Nd_2O_3-4TiO_2$ in Example 16. A process of synthesis of the material will be illustrated by the following process.

(i) 1.37 g (0.01 mol) of barium (Ba) and 80 ml of isopropyl alcohol (i-$C_3H_7OH$) are placed in a three neck flask (volume: 300 ml) equipped with a reflux condenser and heated on an oil bath at 80° C. for 30 minutes under reflux in an atmosphere of nitrogen. As a result, a solution of barium alkoxide [$Ba(OC_3H_7)_2$] in alcohol is produced in the flask.

(ii) A solution of 11.3 g (0.04 mol) of titanium alkoxide [$Ti(OC_3H_7)_4$] dissolved in 100 ml of isopropyl alcohol (i-$C_3H_7OH$), and a solution obtained by dissolving 0.4 g (0.001 mol) of tungsten alkoxide [$W(OC_2H_5)_5$] in 50 ml of isopropyl alcohol (i-$C_3H_7OH$) and reacting them at 80° C. for 30 minutes in an atmosphere of nitrogen are placed in two dropping funnels, respectively, which are attached to a three neck flask.

(iii) The solutions of $Ti(OC_3H_7)_4$ and $W(OC_3H_7)_5$ are simultaneously dropped into the flask for one hour. After being dropped, the reaction solution is maintained at 80° C. and stirred for two hours.

(iv) A solution of 1.8 g (0.1 mol) of water ($H_2O$) and 4.2 g (0.07 mol) of acetic acid ($CH_3COOH$) dissolved in 20 ml of isopropyl alcohol (i-$C_3H_7OH$) is dropwise added with a dropping funnel for 30 minutes.

(v) The reaction solution is stirred for two hours at 80° C., and thereafter, the reflux condenser is replaced by a Liebig condenser or the like to provide an apparatus capable of distilling under reduced pressure.

(vi) With the apparatus, the reaction medium, isopropyl alcohol (i-$C_3H_7OH$) is distilled out to concentrate the reaction solution to 100 ml.

(vii) The concentrated solution is applied using a spinner. In one application, a film having a thickness of 0.01 μm is obtained. For a completely continuous film, the application was repeated ten times in this Example.

(viii) The film is heat-treated at 400° C. for one hour in air to produce a complete thin $BaO-4TiO_2-0.1WO_3$ film.

The substrate of this Example could be easily synthesized because it has a smaller number of structural elements than in Example 16, and on the other hand it has a specific dielectric constant of about 60 at 1 GHz which is lower than in Example 2.

In Examples 16 and 17, alkoxides of barium, neodymium, and tungsten could not have stably existed. The findings that those alkoxides can be produced by heating them in the presence of isopropyl alcohol under reflux have made the Examples practicable.

EXAMPLE 18

Figure 22A:
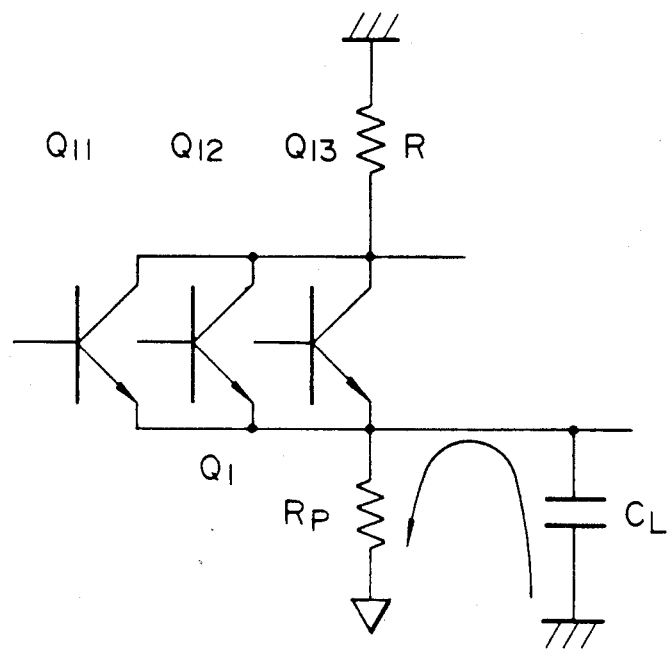
FIGS. 22a and 22b show drawings of a representative NTL circuit and an active pull-down bearing NTL circuit, respectively.
Figure 22B:
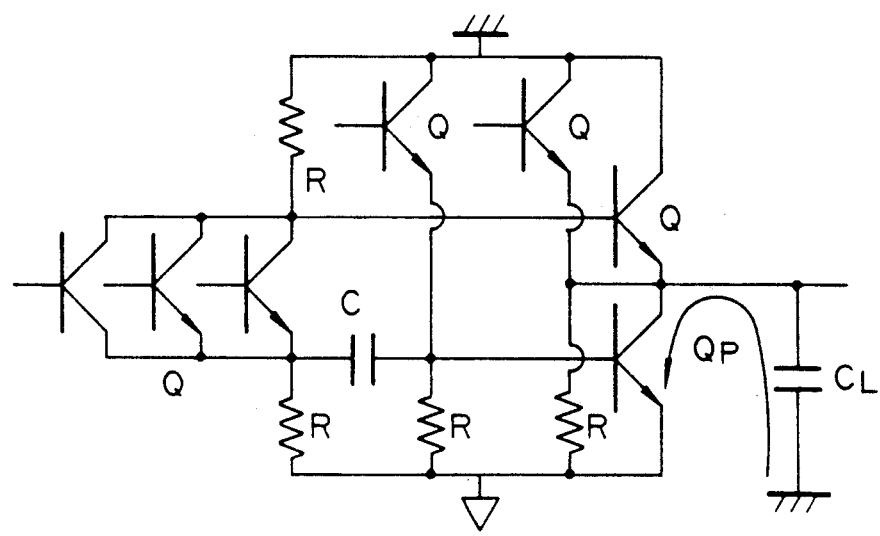

FIG. 22-a shows a representative NTL circuit. FIG. 22-b is a schematic drawing of an active pull-down including a NTL circuit. An ordinary NTL circuit having no pull-down function (FIG. 22-a) gradually discharges the electric charges which have been charged on a free capacitor ($C_L$ in the figure) connected to a load through a resistor ($R_P$) at the output terminal when the output is turned from "low" to "high" (i.e., when $Q_1$ is turned from "on" to "off"). The active pull-down including the NTL circuit is characterized by effecting this discharge actively with a transistor. The transistor designated by $Q_P$ shown on the right in FIG. 22-b is for the pull-down to force the electric charges, which have been charged on a free capacitor ($C_L$ in the figure) connected to a load, to discharge. The discharging route is shown by a curved arrow in the figure. The forced discharge allows a shorter time duration for discharging and operation at a higher speed as compared with the ordinary NTL circuit.

Such abrupt discharge, however, causes a larger variation in current at the time of discharging, which tends to cause a variation in the power supply voltage. This variation may generate noise leading to erroneous operation. In order to avoid this, a capacitor working at a high speed is required. As the variation in voltage due to a variation in current is proportional to an inductance component of the circuit, the distance between the capacitor and the active pull-down including the NTL circuit must be as short as possible to minimize the inductance component therebetween. Any one of the capacitors is required to have frequency response properties which can sufficiently follow input current waves. The integral structure with a ceramic substrate can suppress the generation of an inductance component from the connections to the capacitors (leads and the like) so that the generation of noise voltages is apparently reduced to great extent as compared with that in the case of providing capacitors externally. In addition, it is apparent that the capacitors are required to have a capacitance of at least 0.1 μF.

Next place, as can be seen from FIG. 1, ceramic substrate 3 containing capacitors working at high speed (capacitance: 0.5 μF) was disposed immediately under a LSI chip 1 provided with an active pull-down including a NTL circuit. Furthermore, this Example employed a flip chip bonding scheme having a lower inductance component instead of wire bondings for connection of the ceramic substrate to the LSI chip 1 ensuring the noise reducing effect. As a result, the generation of noise at 1 GHz is suppressed to 10 mV or less so that a sufficient working margin could be ensured.

EXAMPLE 19

Figure 23:
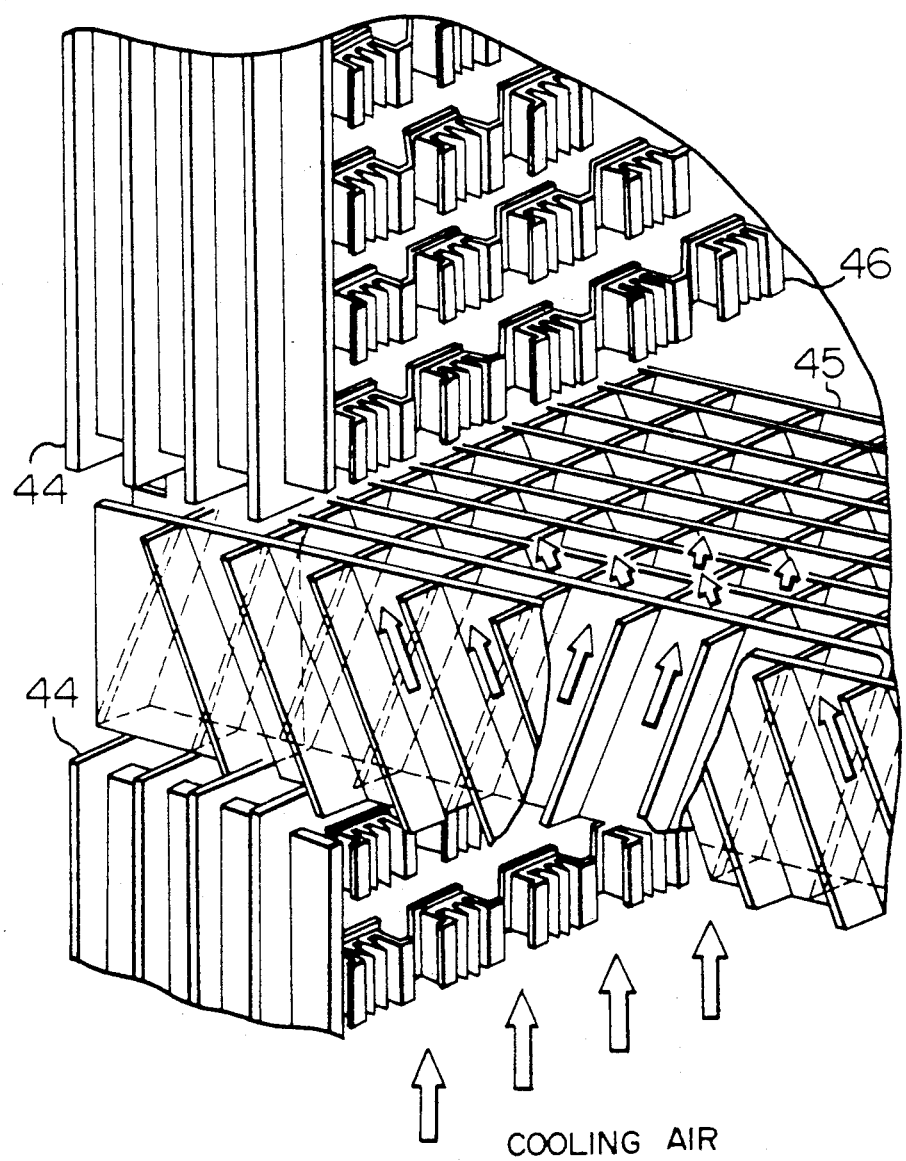
FIG. 23 is a diagrammatical perspective view of a computer using capacitor-carrying semiconductor module according to the present invention.

A ceramic substrate 3 containing capacitors having an electrostatic capacity of 1 μF and a dielectric loss of 0.8% at a ratio of one capacitor to one semiconductor chip and one power supply was packaged in a super computer. A part of the inside of the computer is shown in in FIG. 23. Semiconductor packages 46 having ceramic substrates as explained in Examples 15 to 18 with respect to their production and structure are disposed three-dimensionally on a multi-layer print circuit board 44 and connected to platters with connectors. In this Example, an upper platter and a lower platter are constructed in the form of two separate sections with a cross-flow grid 45 being disposed therebetween, and cooling air is allowed to flow upwardly from under the lower platter through the grid, which arrangement intends to avoid fluctuation in temperature due to the cooling.

Semiconductor packages 46 to be used include logical packages, VR (vector resistor) packages, major storage packages, escape storage packages which may be disposed in high density logical platters.

For logical packages, a logical LSI, RAM module, and the like are used. For VR packages, a logical LSI, VR LSI, and the like are used. For major storage, a DRAM (dynamic random access memory) and the like are used. These packages may be disposed on a printed circuit board by a surface package, axial package, both side package and the like.

According to this Example the variation in power supply voltages (noises) could be suppressed to 100 mV measured as a peak value. As a result, a super computer with an LSI working at a frequency of 1 GHz could be obtained.

As the rising of signals is made faster for speeding up the arithmetic operation, the rising time component in the noise becomes larger in ratio. Without removing this fast rising component, the computers can not normally work.

According to the present invention, the fast rising component which could not be removed by the prior art can be removed. Therefore, the rising of signals to be used for an arithmetic operation can be made faster to achieve an increase in the speed of the arithmetic operation of computers.

What is claimed is:

1. A capacitor-carrying semiconductor module, which comprises:
    a thin film wiring board comprising an organic material layer and conductive wiring lines fromed thereon;
    a ceramic circuit substrate comprising a ceramic insulating layer and wiring lines formed thereon, said thin film wiring board being formed on said ceramic circuit substrate; and
    an LSI mounted on an electric connection formed on said thin film wiring board, wherein capacitors are disposed between said ceramic circuit substrate and said electric connections.

2. The capacitor-carrying semiconductor module according to claim 1, wherein the capacitors are inside of the thin film wiring board.

3. The capacitor-carrying semiconductor module according to claim 1, wherein a through hole is formed in the ceramic insulating layer of the ceramic circuit substrate, and a power line or ground line is formed in the through hole.

4. The capacitor-carrying semiconductor module according to claim 1, wherein the ceramic circuit substrate comprises a plurality of ceramic insulating layers each carrying wiring lines thereon.

5. A capacitor-carrying semiconductor module, which comprises:
    a thin film wiring board comprising a plurality of organic material layers each carrying a layer of conductive wiring lines thereon;
    a ceramic circuit substrate comprising a plurality of ceramic insulating layers each carrying a layer of wiring lines thereon, said thin film wiring board being formed on said ceramic circuit substrate; and
    a plurality of LSIs mounted on electric connections formed on said thin film wiring board, wherein capacitors are disposed between said ceramic circuit substrate and said electric connections.

6. The capacitor-carrying semiconductor module according to claim 5, wherein the capacitors are inside of the thin film wiring board.

7. The capacitor-carrying semiconductor module according to claim 5, wherein through holes are formed in the ceramic insulating layer of the ceramic circuit substrate, and power lines or ground lines are formed in the through holes.

8. The capacitor-carrying semiconductor module according to claim 5, wherein the ceramic circuit substrate comprises a plurality of ceramic insulating layers each carrying wiring lines thereon.

* * * * *